(12) United States Patent
Hasegawa et al.

(10) Patent No.: US 7,549,552 B2
(45) Date of Patent: Jun. 23, 2009

(54) STORAGE CONTAINER

(75) Inventors: Akihiro Hasegawa, Niigata (JP); Hiroshi Mimura, Niigata (JP)

(73) Assignee: Shin-Etsu Polymer Co., Ltd., Tokyo (JP)

( * ) Notice: Subject to any disclaimer, the term of this patent is extended or adjusted under 35 U.S.C. 154(b) by 683 days.

(21) Appl. No.: 11/110,645

(22) Filed: Apr. 20, 2005

(65) Prior Publication Data
US 2005/0230398 A1 Oct. 20, 2005

(30) Foreign Application Priority Data
Apr. 20, 2004 (JP) ............... 2004-123710

(51) Int. Cl.
*B65D 45/28* (2006.01)
(52) U.S. Cl. ............ 220/323; 292/32; 292/33; 292/329; 220/210; 220/324; 206/710; 70/161
(58) Field of Classification Search .......... 70/58, 70/161; 206/454, 710; 220/210, 323, 324, 220/326, 788; 292/32, 33, 42, 60, 69, 121–128, 292/329, DIG. 11
See application file for complete search history.

(56) References Cited

U.S. PATENT DOCUMENTS

| | | | | |
|---|---|---|---|---|
| 1,692,726 | A * | 11/1928 | Estabrooks | ............ 292/113 |
| 4,995,430 | A | 2/1991 | Bonora et al. | |
| 5,711,427 | A | 1/1998 | Nyseth | |
| 5,915,562 | A | 6/1999 | Nyseth et al. | |
| 5,957,292 | A | 9/1999 | Mikkelsen et al. | |
| 6,000,732 | A | 12/1999 | Scheler et al. | |
| 6,622,883 | B1 * | 9/2003 | Wu et al. | ............ 220/323 |
| 2003/0132232 | A1 * | 7/2003 | Eggum | ............ 220/323 |

FOREIGN PATENT DOCUMENTS

| | | |
|---|---|---|
| JP | 2000-58633 | 2/2000 |
| JP | 2003-174081 | 6/2003 |
| WO | WO 01/04022 | 1/2001 |

OTHER PUBLICATIONS

Patent Abstracts of Japan, publication No. 2000-058633 dated Feb. 25, 2000, 2 pgs.
Patent Abstracts of Japan, publication No. 2003-174081 dated Jun. 20, 2003, 2 pgs.

* cited by examiner

*Primary Examiner*—Anthony D Stashick
*Assistant Examiner*—Elizabeth Volz
(74) *Attorney, Agent, or Firm*—Osha • Liang LLP

(57) ABSTRACT

A storage container comprises: a container main body having an opening through which a stored object is placed in or taken out; a lid which fits the opening; a latch mechanism provided on the lid, the latch mechanism having a rotating body rotatably supported by the lid and a pair of longitudinally slidable latch arms operably connected to the rotating body; and a lock mechanism which locks the rotating body when the lid is bolted by the latch mechanism.

5 Claims, 24 Drawing Sheets

STORAGE CONTAINER

BACKGROUND OF THE INVENTION

1. Field of the Invention

The present invention relates to a storage container for storing, shipping, conveying and housing precision substrates such as semiconductor wafers or the like.

2. Description of the Related Art

Recently, miniaturization of semiconductor components and making the pitch of wiring narrow have been increasingly popular. For this reason, high hermetic sealability and automatization of handling in order to prevent contamination of a wafer are required in a wafer container. An example of such a storage container is disclosed in, for example, Japanese Patent Application Laid-Open No. 2000-58633. This storage container comprises a container main body for storing a wafer and a lid for closing an opening of the container main body. The lid is provided with a latch mechanism comprising a rotating cam and a latch plate.

In this storage container the lid is fitted to the opening of the container main body. The latch plate is slid in a longitudinal direction by rotation of the rotating cam. A tip end of the slid latch plate is provided with a latching portion. This latching portion latches a clamp hole of the container main body, whereby the lid is bolted to the container main body.

SUMMARY OF THE INVENTION

However, the rotating cam might be rotated by a shaking or shock when shipping the storage container, since the rotating cam is merely supported rotatably by the lid. When the rotating cam is rotated, the latch plate is slid, whereby the latching portion of the latch plate with respect to the clamp hole of the container main body might come off. Consequently the lid is unbolted, whereby the sealability between the container main body and the lid might be impaired, the lid might come off from the container main body eventually, and the wafer might be contaminated.

The present invention is contrived in consideration of the above-described facts, and is intended to securely bolt the lid to the container main body.

A storage container of the preset invention comprises: a container main body having an opening through which a stored object is placed in or taken out; a lid which fits the opening of the container main body; a latch mechanism provided on the lid, the latch mechanism having a rotating body rotatably supported by the lid and a pair of longitudinally slidable latch arms operably connected to the rotating body; and a lock mechanism which locks the rotating body when the lid is bolted by the latch mechanism.

According to this storage container, since the rotating body is locked by means of the lock mechanism, there is no possibility that the rotating body is rotated easily and the lid is unbolted even when an external force such as a shaking or the like at the time of moving acts. Therefore, the lid is securely bolted to the container main body, the sealability between the container main body and the lid is improved, and a stored product can be prevented from being contaminated.

It is preferred that the lock mechanism comprises a first engaging body provided on the rotating body, and a second engaging body provided on the lid and adapted to engage with the first engaging body.

A storage container of the preset invention comprises: a container main body having an opening through which a stored object is placed in or taken out; a lid which fits the opening of the container main body; a latch mechanism provided on the lid, the latch mechanism having a rotating body rotatably supported by the lid and a pair of longitudinally slidable latch arms operably connected to the rotating body; and a first lock mechanism having a first protrusion provided on the lid and a first hook provided on the rotating body, the first hook being adapted to engage with the first protrusion so as to lock the rotating body when the lid is bolted by the latch mechanism.

Preferably the first hook can be elastically deformed and snap-fitted to the first protrusion.

It is preferred that the storage container further comprises a second lock mechanism which locks the rotating body when the lid is unbolted by means of the latch mechanism. The second lock mechanism preferably comprises a second protrusion provided on the lid and a second hook provided on the rotating body, the second hook being adapted to engage with the second protrusion.

It is preferred that the rotating body comprises a lock arm extending in a radial direction. The both first hook and the second hook are preferably provided on the lock arm.

A storage container of the preset invention comprises: a container main body having an opening through which a stored object is placed in or taken out; a lid which fits the opening of the container main body; a latch mechanism provided on the lid, the latch mechanism having a rotating body rotatably supported by the lid and a pair of longitudinally slidable latch arms operably connected to the rotating body; and a lock mechanism having a first engaging portion provided on the rotating body, a pressuring body with a second engaging portion adapted to engage with the first engaging portion so as to lock the rotating body when the lid is bolted by the latch mechanism, and a biasing member which provides a biasing force against the pressuring body, thereby enabling the pressuring body to contact with the rotating body, the rotating body being rotatable when the pressuring body is separated from the rotating body against the biasing force of the biasing member.

The first engaging portion and the second engaging portion are preferably protrusions that can be engaged with each other.

It is preferred that one of the first engaging portion and the second engaging portion be a protrusion, and that the other one be a depressed portion adapted to engage with the protrusion.

In the rotating body, it is preferred that a through-hole be provided in a direction of a rotational axis and that the pressuring body be operable through the through-hole.

It is preferred that the biasing member comprises an elastic body.

A storage container of the preset invention comprises: a container main body having an opening through which a stored object is placed in or taken out; a lid having a fitting plate which fits the opening of the container main body and a cover plate provided on the fitting plate; a latch mechanism provided on the fitting plate, the latch mechanism having a rotating body rotatably supported by the fitting plate and a pair of longitudinally slidable latch arms operably connected to the rotating body, the latch mechanism being covered by the cover plate; and a lock mechanism having a first engaging portion provided on the rotating body and a second engaging portion provided on the cover plate, the second engaging portion being adapted to engage with the first engaging portion so as to lock the rotating body when the lid is bolted by the latch mechanism.

It is preferred that the first engaging portion and the second engaging portion be protrusions that can be engaged with each other.

It is preferred that one of the first engaging portion and the second engaging portion be a protrusion, and that the other one be a depressed portion adapted to engage with the protrusion.

It is preferred that the lock mechanism further comprises a biasing member which provides a biasing force against the rotating body, thereby enabling the rotating body to contact with the cover plate. The rotating body is preferably rotatable when the rotating body is separated from the cover plate against the biasing force of the biasing member.

It is preferred that the biasing member comprises an elastic body.

The following detailed description and the attached drawings lead to a more full understanding of the present invention. They are provided merely for exemplification, and it should be considered that they are not to limit the present invention.

DESCRIPTION OF THE PREFERRED EMBODIMENTS

Figure 1:
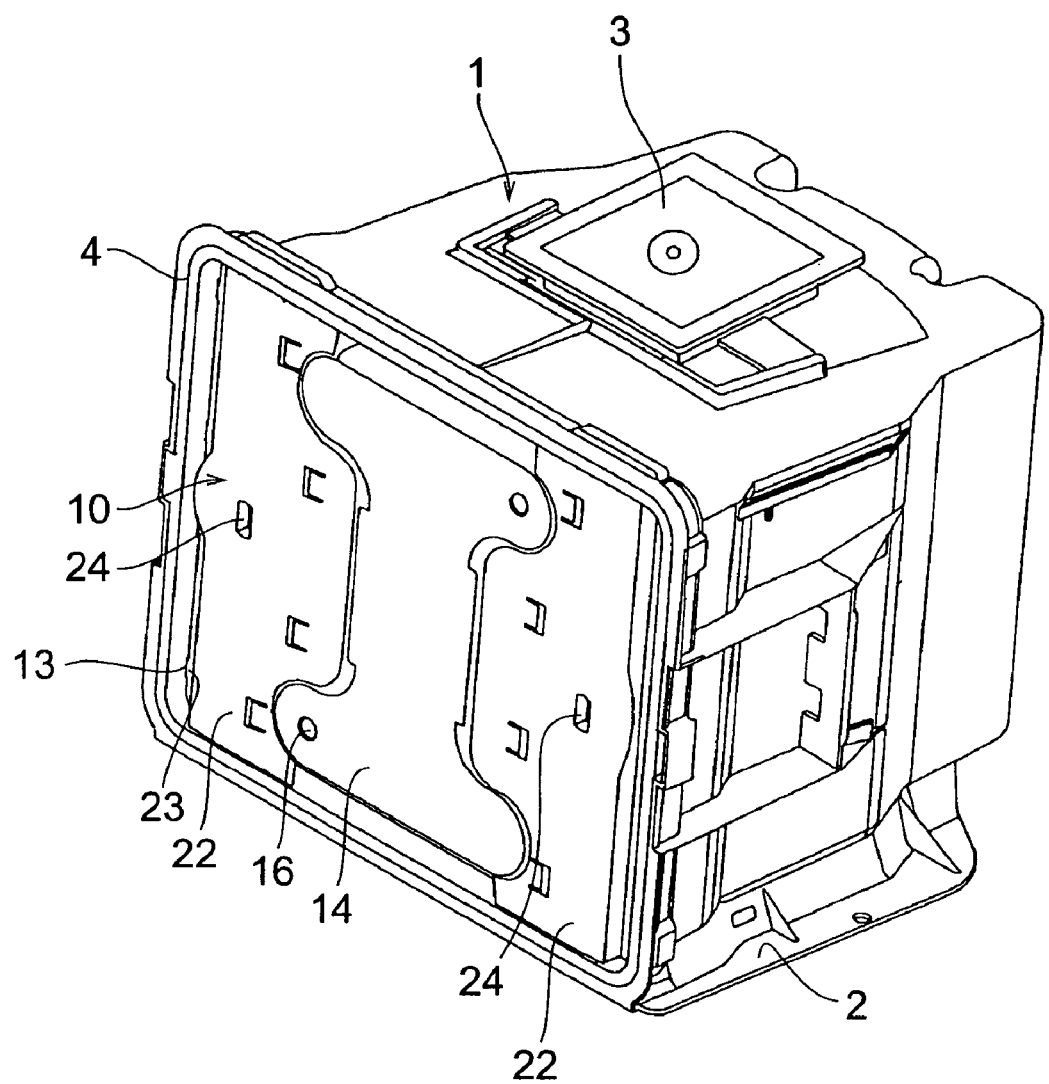
FIG. 1 is a perspective view showing a storage container of a first embodiment.

Embodiments of the present invention will now be described hereinbelow with reference to the attached drawings. It should be noted in the descriptions of the drawings that the same components are marked with the like reference numerals and their repetitive explanations are omitted.

As shown in FIG. 1 to FIG. 8, the storage container according to the present invention comprises a container main body 1 having an opening from which a stored object is taken in and out, a lid 10 for closing the opening of the container main body 1, a pair of latch mechanisms 30 for bolting the lid 10 to the container main body 1, and a pair of lock mechanisms 40 each of which locks a rotating reel 31 of the latch mechanisms 30. This storage container stores a plurality of pieces of precision substrates W (25 or 26 pieces, for example) such as, for example, 12 inch semiconductor wafers.

Figure 2:
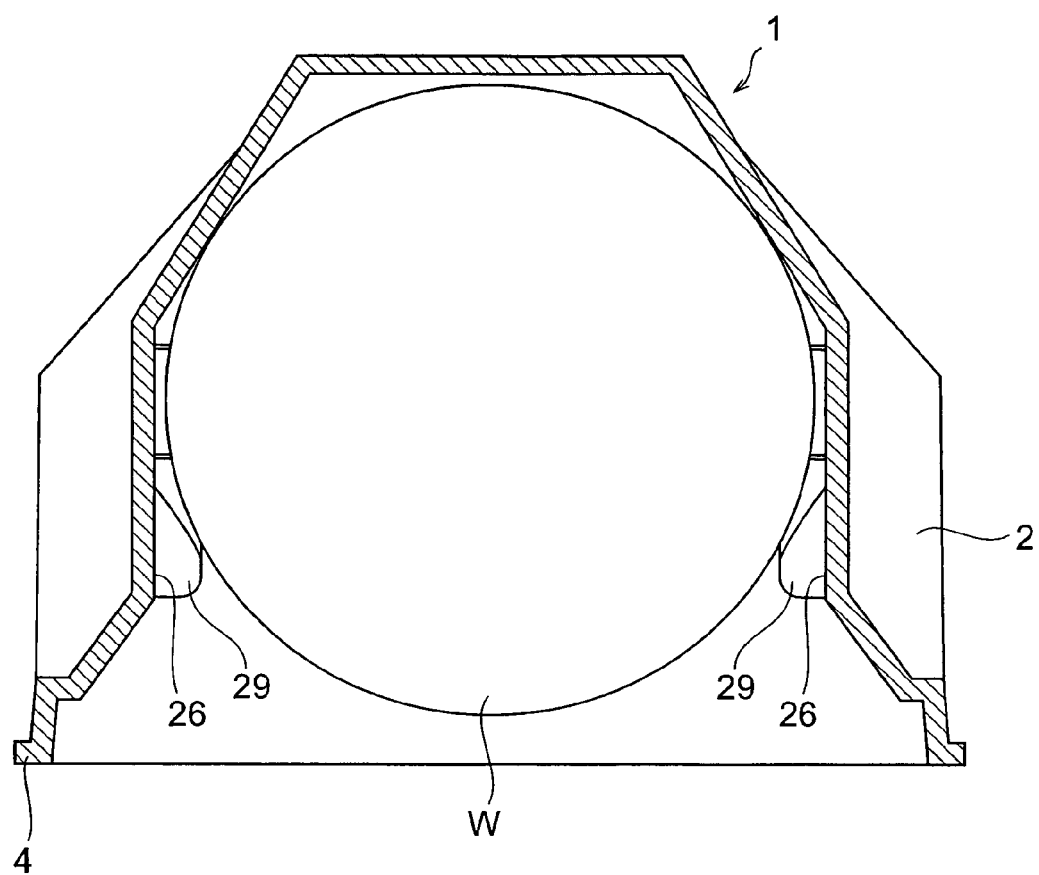
FIG. 2 is a transverse sectional view showing a container main body.
Figure 3:
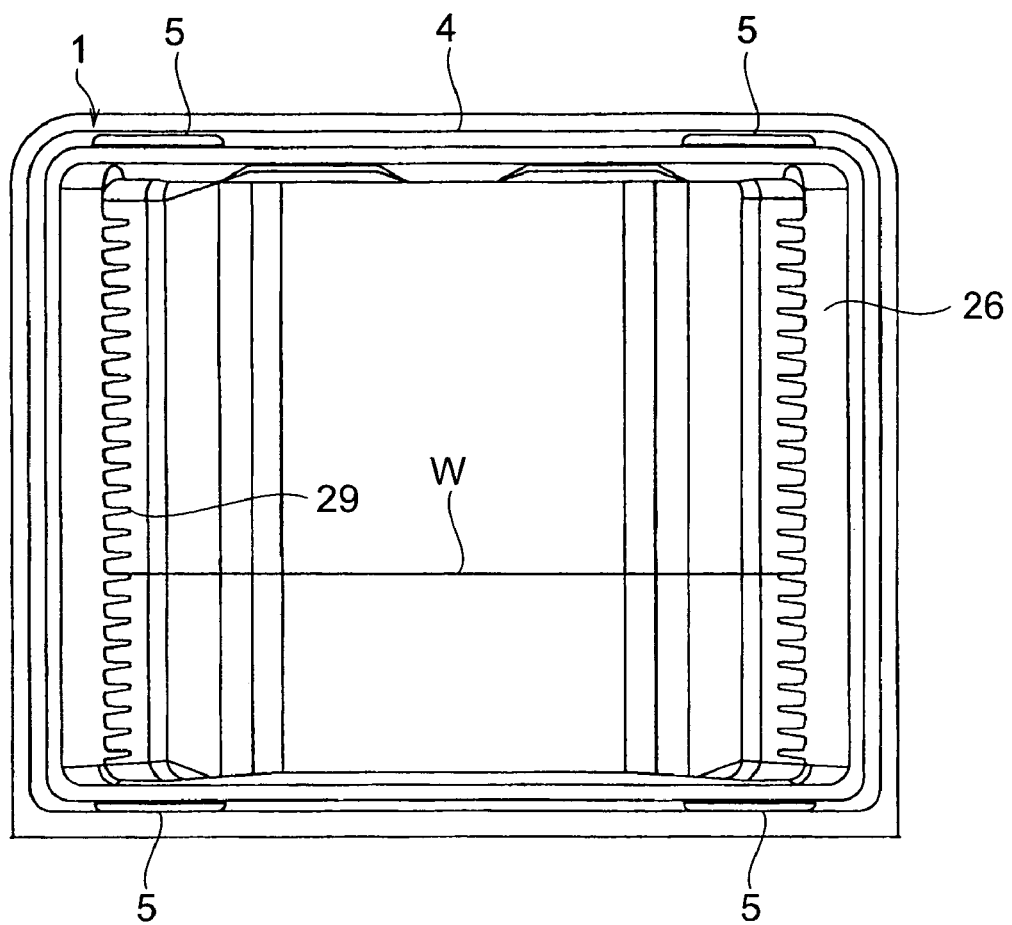
FIG. 3 is an elevational view showing the container main body.

The container main body 1 is formed and shaped into a transparent front open box by a resin, as shown in FIG. 1 to FIG. 3. The container main body 1 has a top wall, a bottom wall, a pair of side walls, a backside wall, and a front opening. A back part of the pair of side walls partially slope inward. The container main body 1 arranges in array and stores the plurality of pieces of the precision substrates W in a vertical direction on the level.

Inside of the pair of side walls is provided with supporting plates 26 integrally or detachably. The opposing faces of a pair of the supporting plates 26 are provided with approximately circular teeth 29 at predetermined pitches in a vertical direction in a plane. The right and left pair of teeth 29 support the precision substrates W approximately horizontally.

Although not shown in the figures, a flat plate which is formed into an approximately circular shape so as to follow a peripheral portion of the precision substrate W, a front medium thickness region which is formed on an upper side of the front inside where the flat plate is formed with curvature, a front thick region which is formed on an upper side of the front outside of the flat plate and is positioned outside the front medium thickness region, i.e. positioned on the supporting plate 26 side, a rear medium thickness region which is formed in the rear of the flat plate, a rear thick region which is formed on an upper side of the rear of the flat plate and positioned in the front of the rear medium thickness region and on the supporting plate side, and a rear thick region which is formed on the rear of the flat plate and is positioned in the front of the rear medium thickness region and on the supporting plate side form each of the teeth 29. A step where the precision substrate W contacts is formed between the front medium thickness region and the front thick region, and the precision substrate W is supported approximately horizontally to the flat front medium thickness region and the rear medium thickness region.

Although not shown, positioning tools which is positioned by processing equipment mounting the storage container are integrally formed on both sides of the front part and in the center of the rear part of the bottom wall of the container main body 1 respectively. In the rear part of the bottom wall of the container main body 1, a small bottom plate is attached detachably from behind by means of a thin plate. The type of the storage container, the number of precision substrates, or the like are figured out by using the processing equipment to identify one or plurality of identifying bodies that are embedded in the bottom plate.

As shown in FIG. 1 and FIG. 2, a guide rail 2 extending in a cross direction is stretch-formed on both sides of the bottom wall of the container main body 1. The guide rail 2 provides a convenience for conveying the storage container. An approximately rectangular robotic flange 3 is attached integrally or detachably in a central part of the top wall of the container main body 1. The storage container is conveyed by using an automatic conveyer called "OHT (overhead transport)" to hold the robotic flange 3.

A peripheral portion forming a front opening of the container main body 1 is stretched in an outside direction to form a rim portion 4. As shown in FIG. 3, a rectangular latching hole 5 for bolting the lid 10 is formed inside the top and bottom of the rim portion 4. A conveying handle can be attached to the side wall of the container main body 1. The storage container can be conveyed by grasping this conveying handle.

It should be noted that the container main body 1, supporting plates 26, teeth 29, positioning tools, bottom plate, guide rail 2, robotic flange 3, and conveying handle can be formed and shaped by using, for example, polycarbonate, polyether imide, poly-etheretherketone, cyclic olefin resin, or the like. An electric conductive agent or the like is appropriately added to these materials.

As shown in FIG. 1, and FIG. 4 to FIG. 8, the lid 10 comprises a fitting plate 11 which is detachably fitted inside the rim portion 4 of the container main body 1 to close the front opening, and a right and left pair of cover plates 22. The fitting plate 11 has a peripheral wall, and is formed into a dish shape where the center thereof is concave. This concave part is provided a right and left pair of latch mechanisms 30. The pair of cover plates 22 cover the pair of latch mechanisms 30 respectively. The fitting plate 11 is formed in to an approximately rectangle when viewed from the front, and is chamfered roundly. The peripheral wall is formed in to an approximately L-shape cross-sectionally, an approximately H-shape, or an approximately Z-shape so as to secure rigidity. An endless seal gasket 28 is fitted to the outside of the peripheral wall. The seal gasket 28 is deformed and bonded inside the rim portion 4 of the container main body 1, thereby securing the sealability.

The seal gasket 28 comprises, for example, a cyclic substrate, and a tapered bent chip which is protruded and extends to the outside while sloping from the substrate. The seal gasket 28 is held such that a fitting rib (not shown) formed by being protruded from the substrate is press-fitted to a fitting-holding groove (not shown) formed on the peripheral wall of the fitting plate 11. When a differential pressure is generated inside and outside the storage container sealed by the lid 10, the seal gasket 28 prevents gas containing dust from flowing into the inside from the outside of the storage container, and at the same time functions as a unidirectional seal for letting the gas out of the storage container from the inside thereof.

Such a seal gasket 28 is formed so as to be elastically deformed by using, for example, a silicone rubber, a fluororubber, a thermoplastic polyester elastomer, thermoplastic polyolefin elastomer, or the like.

A plurality of draining holes (not shown) used at the time of washing are provided, leaving predetermined spaces, on the peripheral wall of the fitting plate 11. Further, a right and left pair of openings 12 are formed, leaving predetermined spaces, in the top and bottom of the peripheral wall. The position where each of the openings 12 is formed corresponds to the position where the latching hole 5 of the container main body 1 is formed. A plurality of fixing holes 13 for fixing the cover plate 22 are formed, leaving predetermined spaces, on both the right and left peripheral walls of the fitting plate 11.

A swollen seat 14 for grasping the lid 10 when opening and closing the lid 10 is fixedly or detachably provided in a surface central portion of the fitting plate 11, as shown in FIG. 1. The external form of the swollen seat 14 is an I-shape when viewed from the front, where a pair of positioning holes 16 which are used when positioning the lid 10 are provided diagonally, with a center point therebetween. A right and left pair of installation spaces 15 for installing the latch mechanism 30 are formed between the swollen seat 14 and the peripheral wall of the fitting plate 11.

The circumference of the swollen seat 14 is provided with the plurality of fixing holes 13 for fixing the cover plate 22, with leaving predetermined spaces. The fixing holes 13 are provided in the installation spaces or the vicinity thereof as well when needed. As shown in FIG. 4 to FIG. 7, each of the installation spaces 15 is provided with a cylindrical rib 17, and a pair of cams 19 positioned above and below the cylindrical rib 17 so as to sandwich it therebetween.

Figure 8:
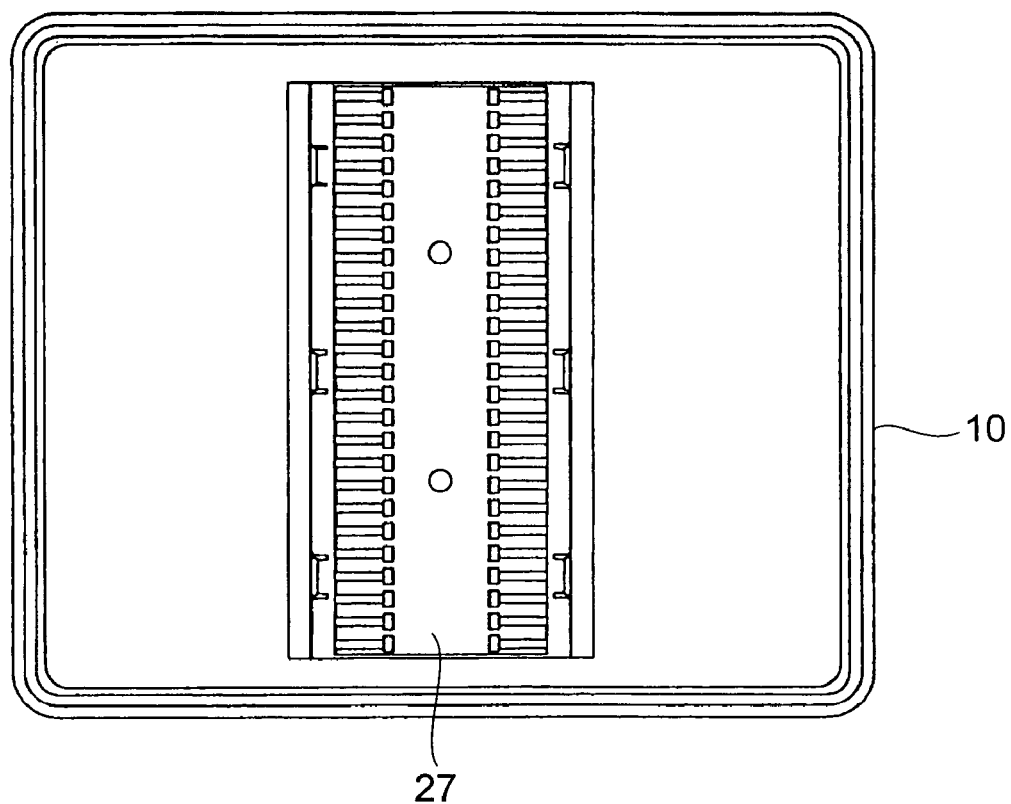
FIG. 8 is a figure showing the back of the lid.

The cylindrical rib 17 has cuts which are formed in an axial direction by a slit 18 at intervals of 90 degrees, for example, whereby the cylindrical rib 17 is divided into a plurality of pieces. Each of the cams 19 comprises a right and left pair of cam rails 20 which extend parallel in a vertical direction at intervals. A cam face 21 having a smooth asperity is formed on the surface of each of the cam rails 20. As shown in FIG. 8, a central portion on the back of the fitting plate 11 is provided with a front retainer 27 having elasticity. The periphery of the precision substrate W is sandwiched between the font retainer 27 and a rear retainer (not shown) having elasticity and provided inside the backside wall of the container main body 1, whereby the precision substrate W is elastically supported.

As shown in FIG. 1, the cover plate 22 is formed into a shape so as to substantially correspond to the installation spaces 15. A plurality of fixing chips 23 are formed in a protruded manner in wall portions on the both right and left sides of the cover plate 22, or the like. The fixing chips 23 are fitted to the fixing holes 13 of the fitting plate 11, whereby the cover plate 22 is fixed to the fitting plate 11. An operation through-hole 24 for operating the latch mechanism 30 is formed in the vicinity of the central portion of the cover plate 22. The operation through-hole 24 is a rectangle when views from the front, and an operation key 60 of a lid opening/closing device is inserted into the operation through-hole 24.

Figure 4:
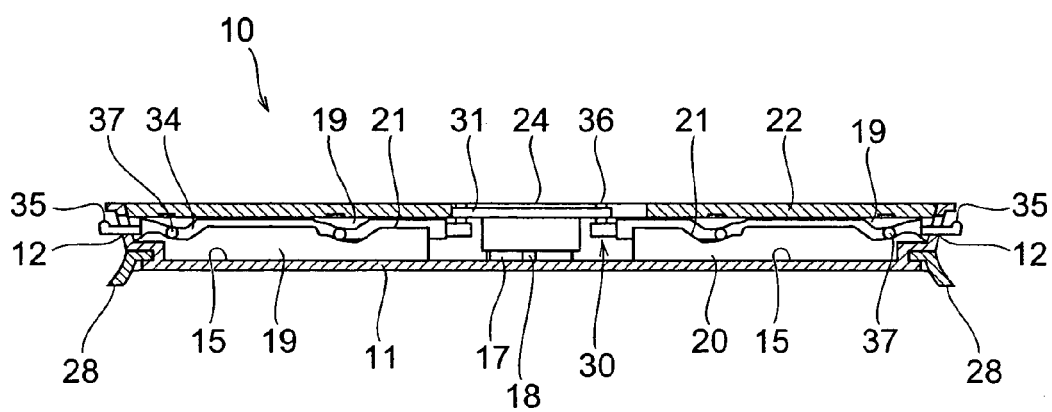
FIG. 4 is a cross sectional view showing a lid and a latch mechanism.
Figure 5:
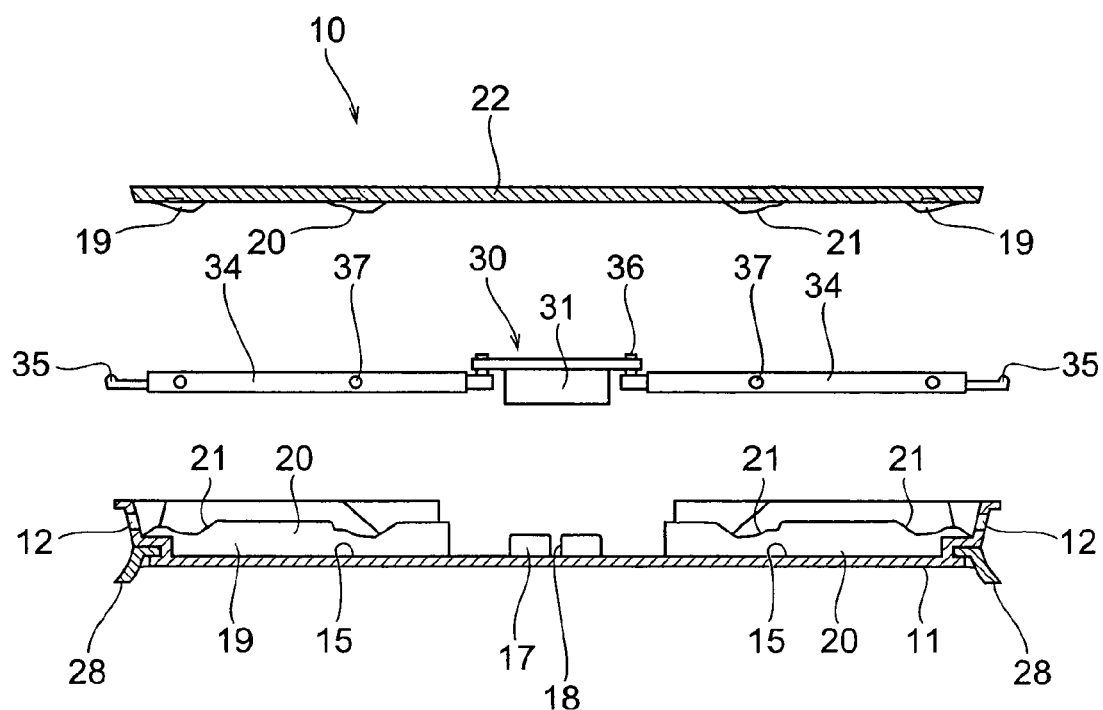
FIG. 5 is an exploded cross sectional view showing the lid and the latch mechanism.

The back of the cover plate 22 is provided with cams 19 leaving gaps and facing the cams 19 provided on the fitting plate 11, as show in FIG. 4 and FIG. 5. The cams 19 on the cover plate 22 side have the right and left pair of cam rails 20 which extend parallel in a vertical direction. The cam face 21 having a smooth asperity is formed on the surface of each of the cam rails 20.

It should be noted that the lid 10 can be formed and shaped by using, for example, polycarbonate, fluorine-containing polycarbonate, poly-butylene terephthalate, poly-etheretherketone, polyether imide, polyacetal, or the like.

The latch mechanism 30 comprises a rotating reel 31 and a pair of latch arms 34, as shown in FIG. 4 to FIG. 7. The rotating reel 31 is rotatably supported by the cylindrical rib 17 of the fitting plate 11. The rotating reel 31 can be operated by rotation by means of the external operation key 60. The latch arms 34 are slidably held in a sandwiched manner in a longitudinal direction between the cams 19 on the fitting plate 11 side and the cams 19 on the cover plate 22 side. The latch arms 34 are operably connected to the rotating reel 31. The latch arms 34 are slid linearly in a longitudinal direction by rotation of the rotating reel 31. A tip end of the latch arm 34 is provided with a latching nail 35 which is latched by the latching hole 5 provided in the rim portion 4 of the container main body 1.

As shown in FIG. 5 to FIG. 7, FIG. 9 and FIG. 10, the rotating reel 31 is provided in the form of a circular disk, where a hollow cylinder portion 31a is formed in a bottom face thereof. A central portion of the surface of the rotating reel 31 is provided with an approximately rectangular operation hole 32, when viewed from the front, to which the external operation key 60 is fitted. Further, a pair of guiding grooves 33 for converting the rotation motion of the reel 31 to the linear motion of the latch arm 34 are formed in an arc in the rotating reel 31. The operation key 60 is inserted in to the operation hole 32 from the outside, whereby the rotating reel 31 having such a constitution is rotated by 90 degrees clockwise or half clockwise.

It should be noted that a connection position or the size of the lid opening/closing device is defined for each size of the container by the SEMI standard. For example, in a storage container which arranges in array and stores 12 inch (300 mm) semiconductor wafers, the specification of a device interface for automatically opening and closing the lid 10 are defined so as to be able to correspond to the lid opening/closing device which is standardized by E62 of the SEMI standard.

Figure 6:
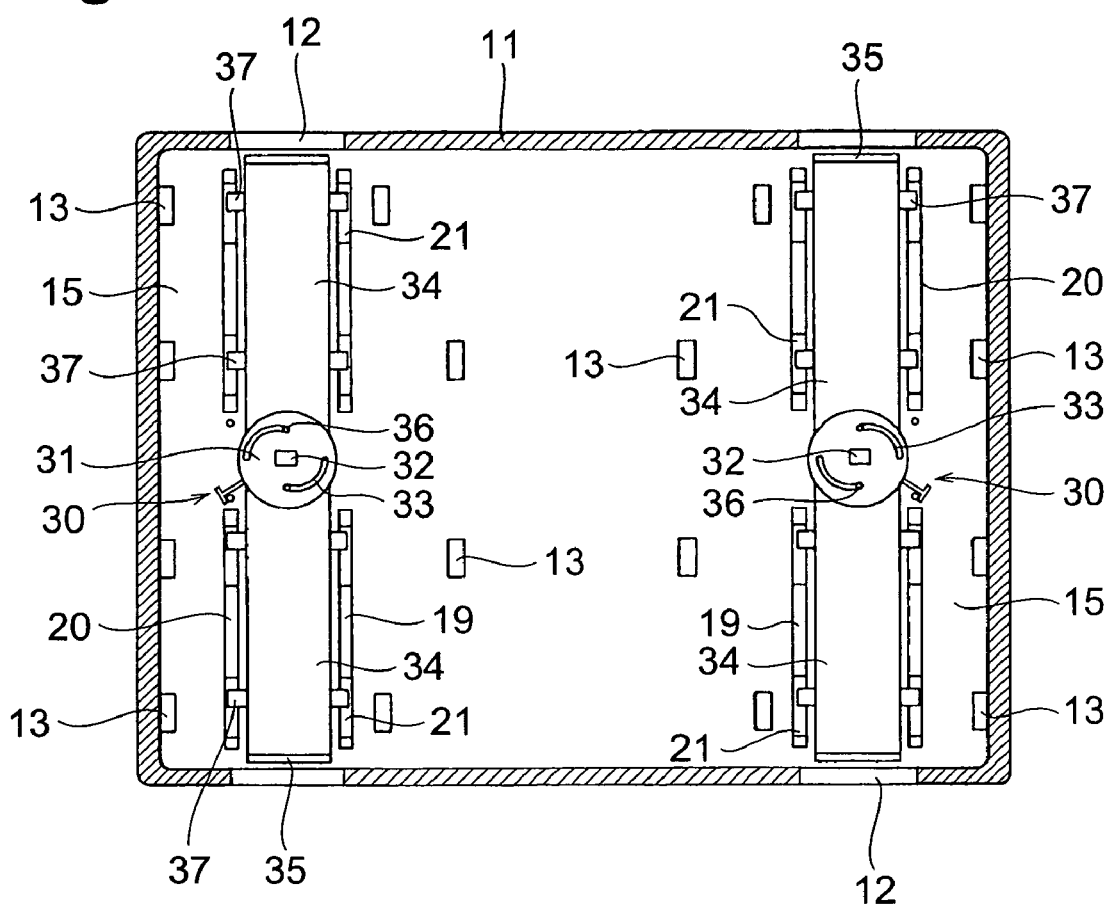
FIG. 6 is a front cross sectional view showing the lid in an unbolted state (state in which a cover plate is removed).
Figure 7:
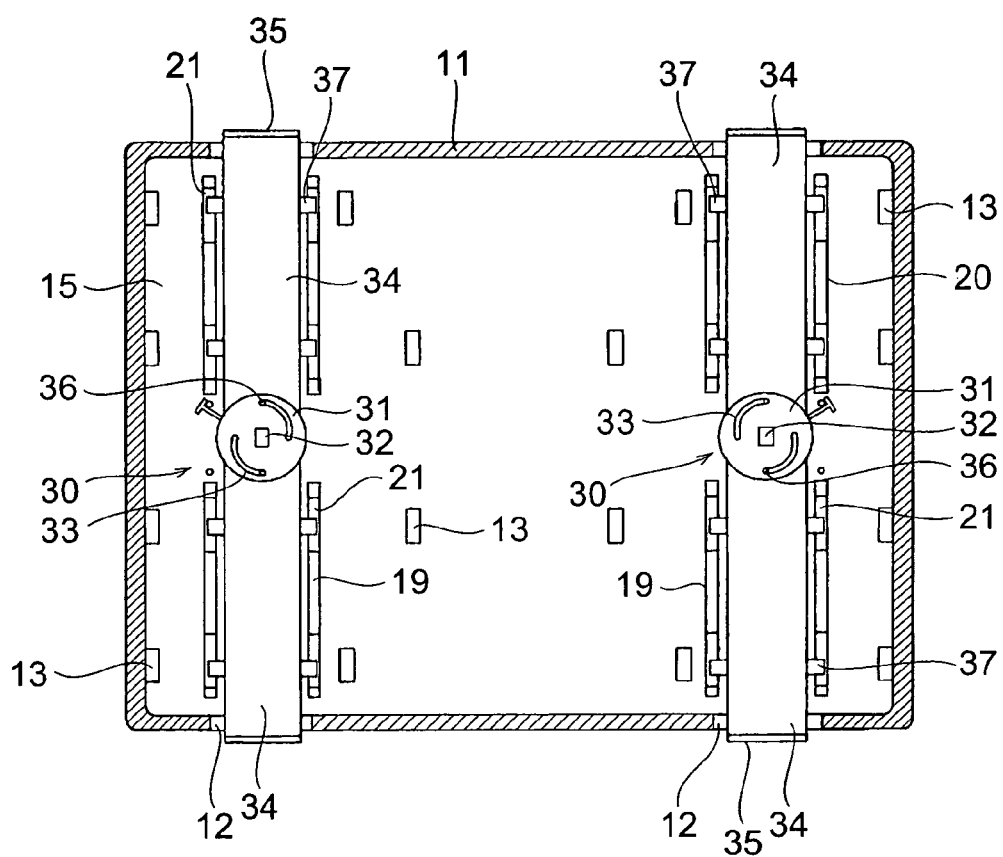
FIG. 7 is a front cross sectional view showing the lid in a bolted state (state in which the cover plate is removed).

As shown in FIG. 6 and FIG. 7, the latch arms 34 formed in the form of an approximately rectangular plate in accordance with the width of the pair of the cam rails 20. The latch arms 34 are disposed on the pair of cam rails 20 such that the center line in a longitudinal direction intersects with a rotation axis of the rotating reel 31. The latching nail 35 having an approximately cross-sectionally L-shape is provided in a leading end of the latch arm 34, and a pin 36 is provided in a tail end of same. The pin 36 is directly embedded in the guiding groove 33 of the rotating reel 31. It should be noted that the pin 36 may be indirectly embedded in the guiding groove 33 via a rotating roller for preventing generation of dust.

A plurality of cylindrical protrusions 37 are provided, leaving predetermined spaces, in the both left and right portions of the latch arms 34. The cylindrical protrusions 37 are brought into direct contact with the cam face 21 of the came rail 20 and slide. It should be noted that the cylindrical protrusions 37 may be indirectly brought into contact with the cam face 21 of the cam rail 20 via the rotating roller for preventing generation of dust.

It should be noted that the latching nail 35 provided in the latch arm 34 is provided with a taper, and that a contact area which is brought into contact with the latching hole 5 of the rim portion 4 is preferably reduced. In this manner, the resistance can be reduced when the latching nail 35 is fitted to the latching hole 5. Moreover, the latch mechanism 30 can be formed and shaped by using, for example, polycarbonate, fluorine-containing polycarbonate, poly-butylene terephthalate, poly-etheretherketone, polyether imide, polyacetal, or the like.

As shown in FIGS. 6, 7, 9, and 10, the lock mechanism 40 comprises a first hook 70 and a first pin 44 with which the first hook 70 is engaged. On the back side of the rotating reel 31 is provided with a lock arm 41 extending in a radial direction, a short chip 42 is provided at right angles in a tip end of the lock arm 41. The first hook 70 is constituted by the lock arm 41 and the short chip 42. The first pin 44 is provided in a cylindrical form on the fitting plate 11 of the lid 10. Therefore, by rotating the rotating reel 31 in a direction of bolting and engaging the first pin 44 with a concave part 43 of the first hook 70, the rotating reel 31 is locked in a state where the lid 10 is bolted. It should be noted that the first hook 70 has elasticity and is snap-fitted to the first pin 44 by elastically deforming the first hook 70.

Further, a second hook 71 is constituted by the lock arm 41 and the short chip 42. A second pin 44A is provided in a cylindrical form on the fitting plate 11 of the lid 10. Therefore, by rotating the rotating reel 31 in a direction of unbolting and engaging the second pin 44A with the concave portion 43 of the second hook 71, the rotating reel 31 is locked in a state where the lid 10 is unbolted. It should be noted that the second hook 71 has elasticity and is snap-fitted to the second pin 44A by elastically deforming the second hook 71.

Further, it should be noted that the first and second pins 44 and 44A are provided higher than the height position of the lock arm 41 and are prevented from bridging when engaged with the first and second hooks 70 and 71.

In the storage container of the above constitution, when using the lid 10 to close the front opening of the container main body 1 which arranges and stores the plurality of precision substrates W, the lid opening/closing device embeds the lid 10 in the rim portion 4 of the container main body 1 to rotate the rotating reel 31 of the latch mechanism 30 by 90 degrees from the state of FIG. 6. Consequently the latch arm 34 slides linearly in a longitudinal direction while being guided by the cam face 21 of the cam 19. Accordingly, as shown in FIG. 7, the latching nail 35 of the latch arm 34 is protruded through the opening 12 provided on the peripheral wall of the fitting plate 11, and latched with the lathing hole 5 of the container main body 1. As a result, the lid 10 is bolted to the container main body 1.

Figure 10:
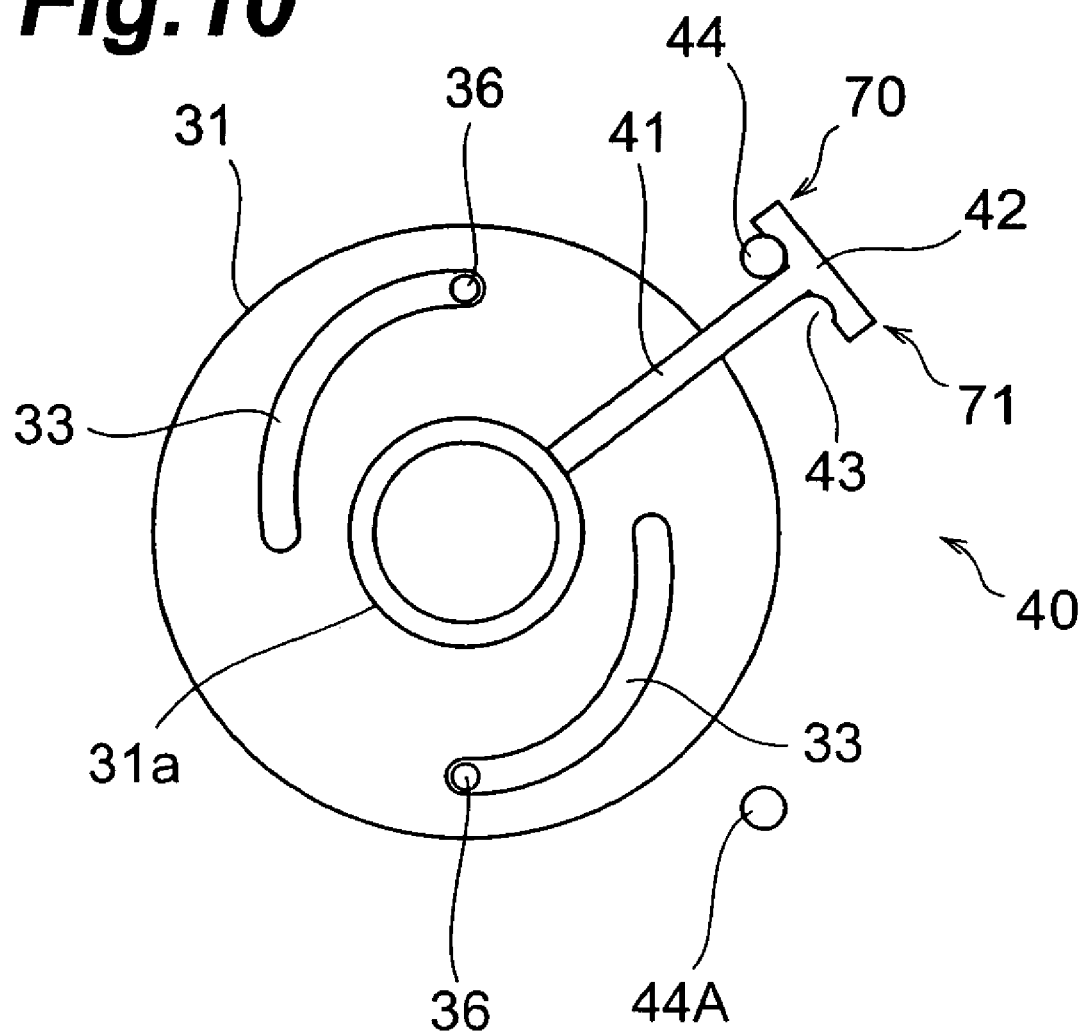
FIG. 10 is a figure showing a condition in which the rotating reel is locked in the bolted state.

Along with the rotation of the rotating reel 31, the lock arm 41 is turned, engagement between the second hook 71 and the second pin 44A is removed, and, as shown in FIG. 10, the first pin 44 is engaged with the concave portion 43 of the first hook 70. Accordingly, the rotating reel 31 is locked.

On the other hand, when removing the lid 10 from the container main body 1 which arranges and stores the plurality of precision substrates W, the lid opening/closing device rotates the rotating reel 31 90 degrees from the state of FIG. 7. Consequently the latch arm 34 slides linearly in a longitudinal direction while being guided by the cam face 21 of the cam 19. Accordingly, as shown in FIG. 6, the latching nail 35 of the latch arm 34 slides back through the opening 12 provided on the peripheral wall of the fitting plate 11. As a result, the lid 10 is unbolted and can be removed from the container main body 1.

Figure 9:
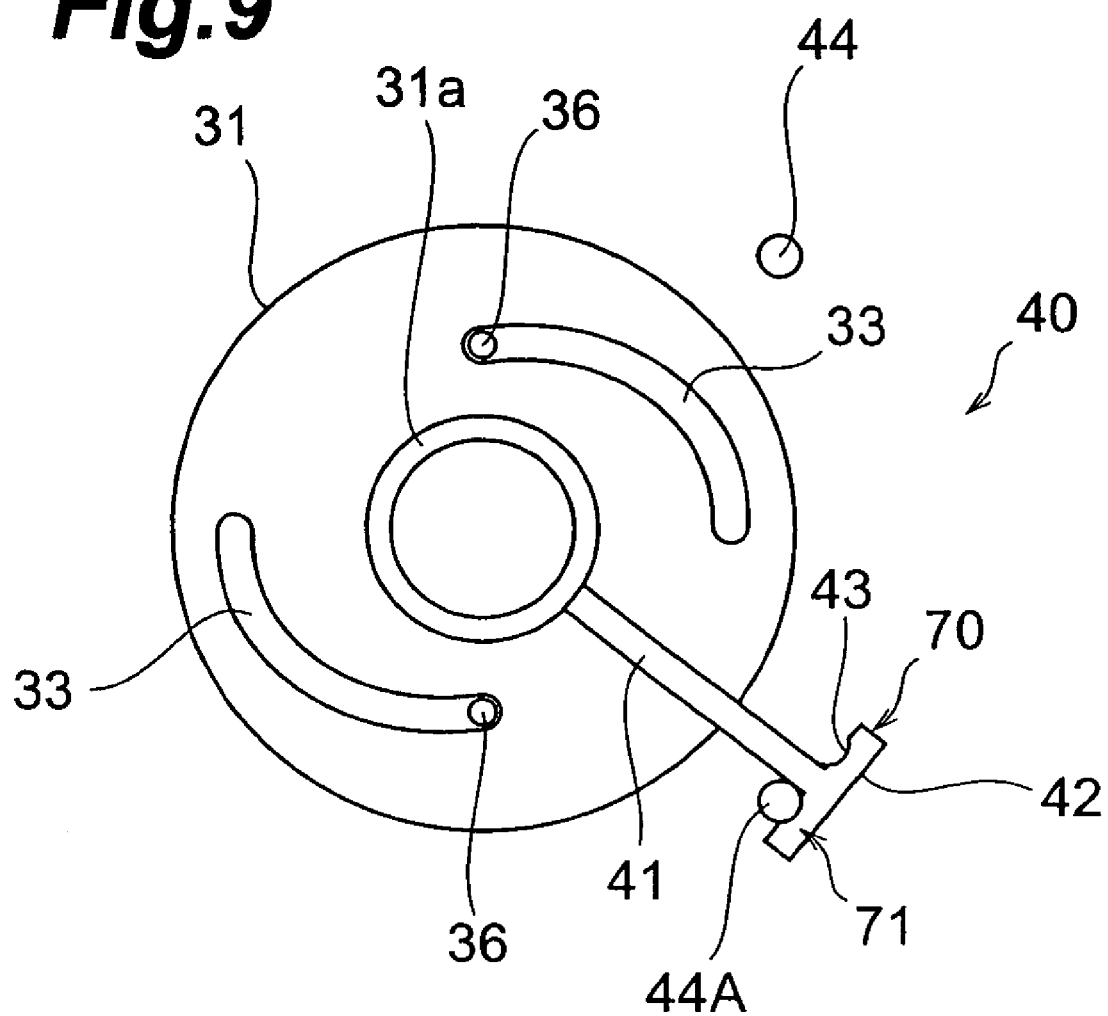
FIG. 9 is a figure showing a condition in which a rotating reel is locked in the unbolted state.

Along with the rotation of the rotating reel 31, the lock arm 41 is turned, engagement between the first hook 70 and the first pin 44 is removed, and, as shown in FIG. 9, the second pin 44A is engaged with the concave portion 43 of the second hook 71. Accordingly, the rotating reel 31 is locked.

It is preferred that, even when a rotation angle position of the rotating reel 31 is off the range of +/−10 degrees from a regular rotation angle position where the hooks 70 and 71 are engaged with the pins 44 and 44A, the rotating reel 31 can be automatically led to the regular rotation angle position, in view of variability of the size of the storage container or the movement of the lid opening/closing device. Specifically, it is preferred that the shapes or the like of the hooks 70 and 71 and the pins 44 and 44A be adjusted so that the rotating reel 31 can be automatically led to the regular rotation angle position, even when the rotation angle position of the rotating reel 31 is off the regular rotation angle position, taking an angle for leading to the hooks 70 and 71 and the pins 44 and 44A as a range of +/−10 degrees, preferably +/−5 degrees.

According to the above constitution, since the engagement between the first hook 70 and the first pin 44 causes locking of the rotating reel 31 when the lid 10 is bolted by the latch mechanism 30, there is no possibility that the rotating reel 31 is rotated by accident by a shaking or a shock at the time of shipping. Therefore, it is possible to extremely effectively prevent the sealability between the container main body 1 and the lid 10 from being impaired, the lid 10 from being removed from the container main body 1, and the precision substrate W from being contaminated.

Moreover, since the lock arm 41 does not bridge the first and second pins 44 and 44A, the rotating reel 31 can be prevented from being rotated excessively. Further, since the rotating reels 31 can be locked with such simple constitutions as the first and second hooks 70 and 71, the first and second pins 44 and 44A, and the lock arm 41, reduction of the production cost, simplification and weight saving of the constitutions, can be achieved. Furthermore, since the fixing chips 23 are merely embedded in the fixing holes 13 without using screws when fixing the cover plate 22 to the fitting plate 11, the cover plate 22 can be fixed or removed easily, thus cleaning and drying can be performed smoothly, efficiently, and easily.

Next, a storage container according to a second embodiment is now described with reference to FIG. 11 to FIG. 17. The storage container of the second embodiment is different from the storage container of the first embodiment, mainly in terms of the constitution of the lock mechanism 40.

The lock mechanism 40 comprises a first protrusion 49 provided in the rotating reel 31, a pressuring body 45 having a second protrusion 50 engaged with the first protrusion 49, and an elastic body 48 biasing the pressuring body 45.

Figure 11:
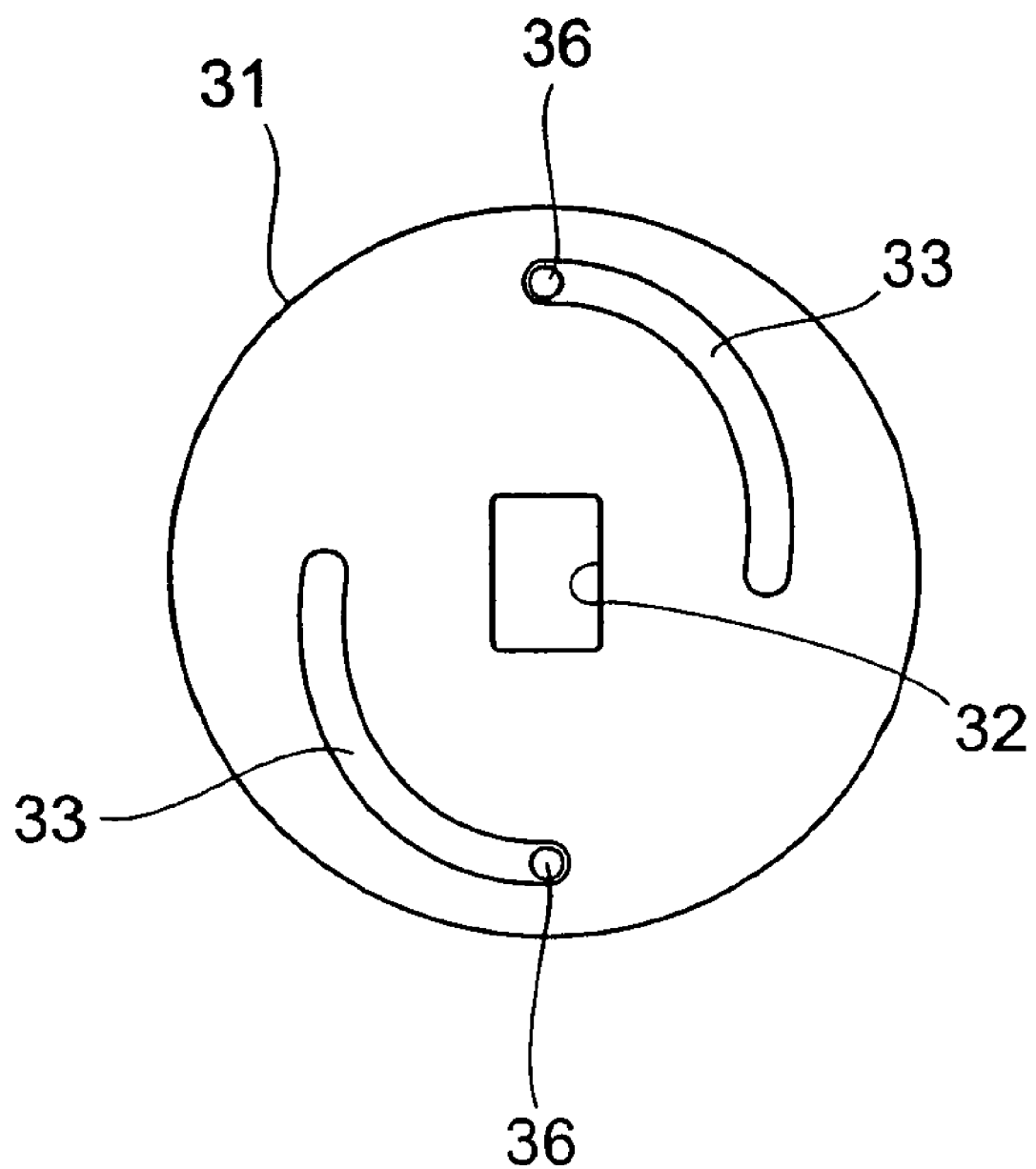
FIG. 11 is a figure showing a surface of a rotating reel of a storage container of a second embodiment.
Figure 12:
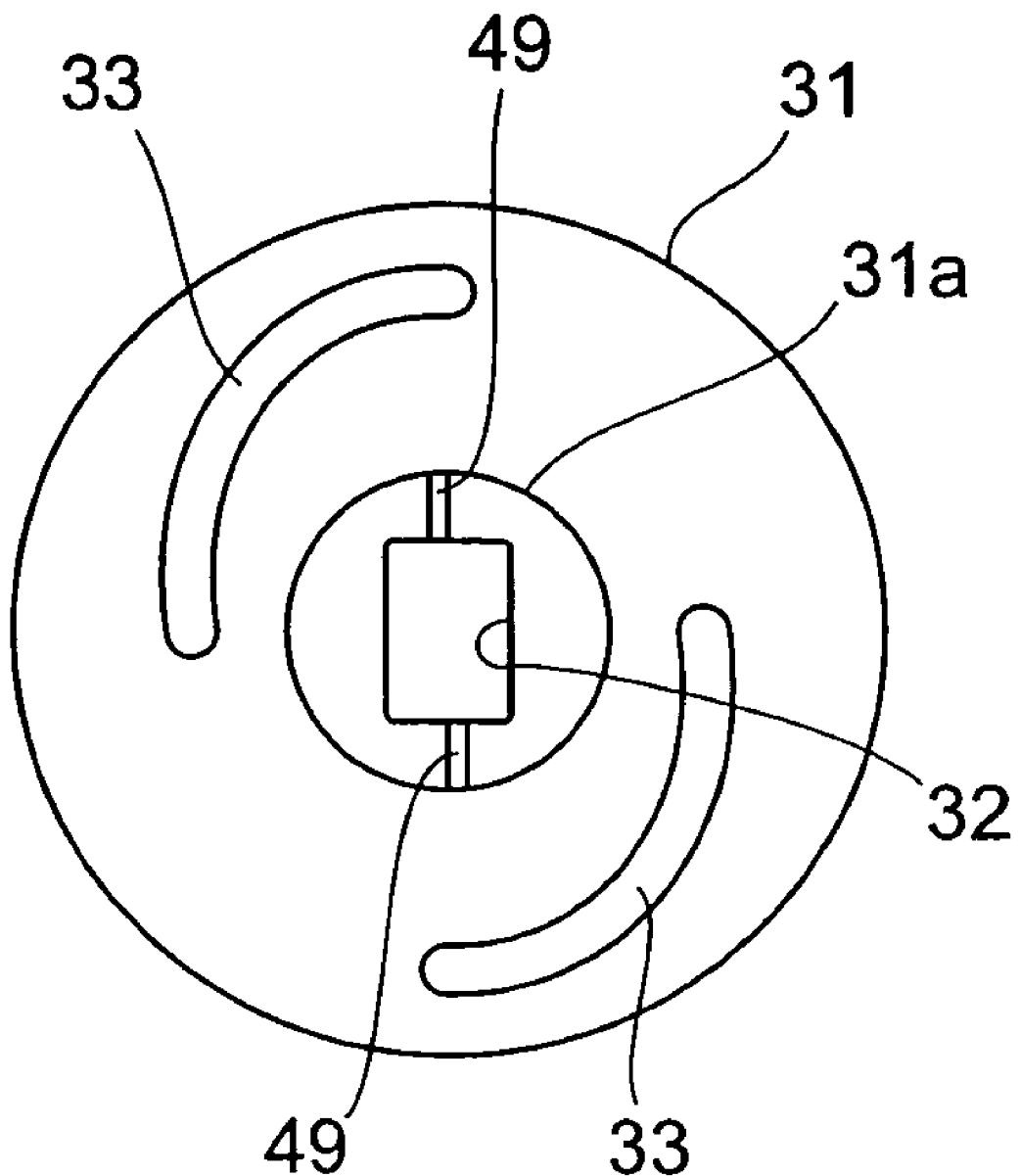
FIG. 12 is a figure showing the back of the rotating reel shown in FIG. 11.
Figure 13:
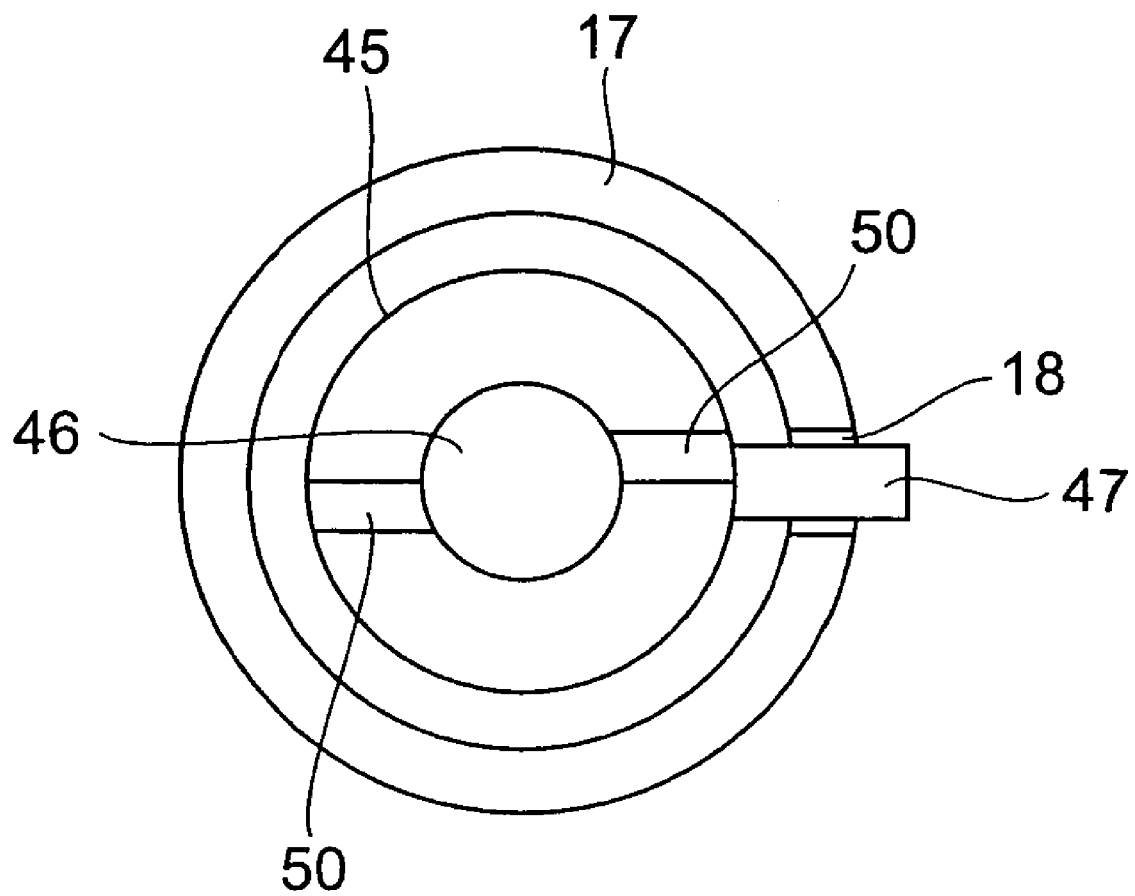
FIG. 13 is a figure showing pressuring body embedded in a cylindrical rib.
Figure 14:
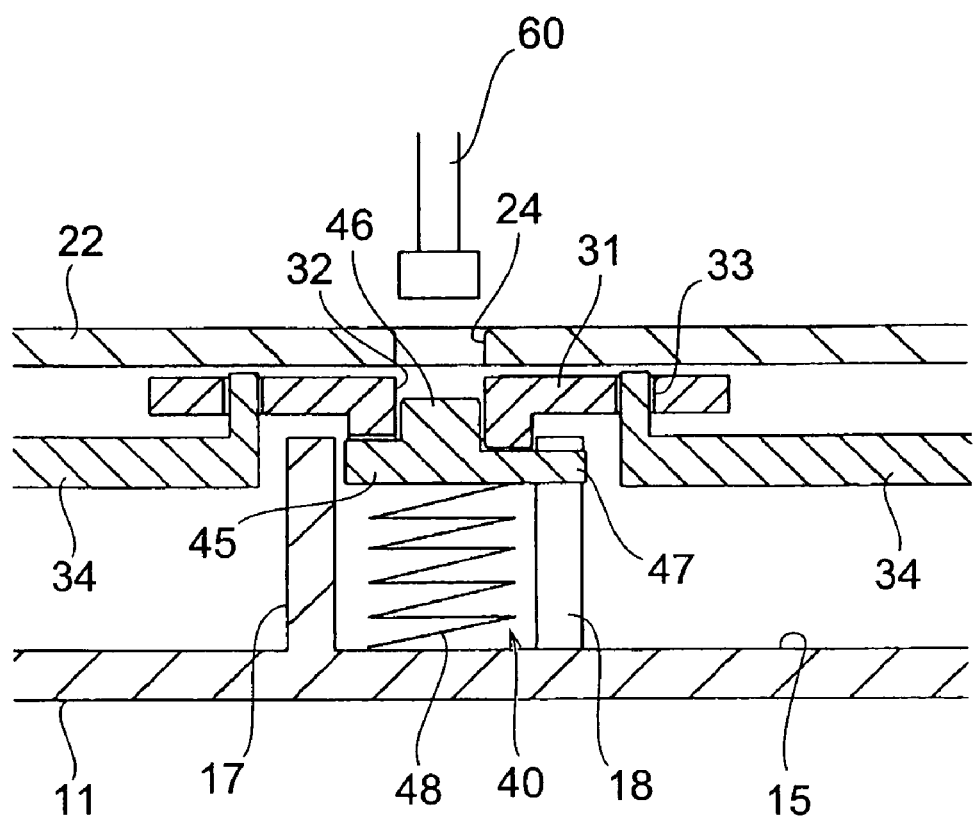
FIG. 14 is a cross sectional view showing a lock mechanism before an operation performed by means of an operation key.
Figure 15:
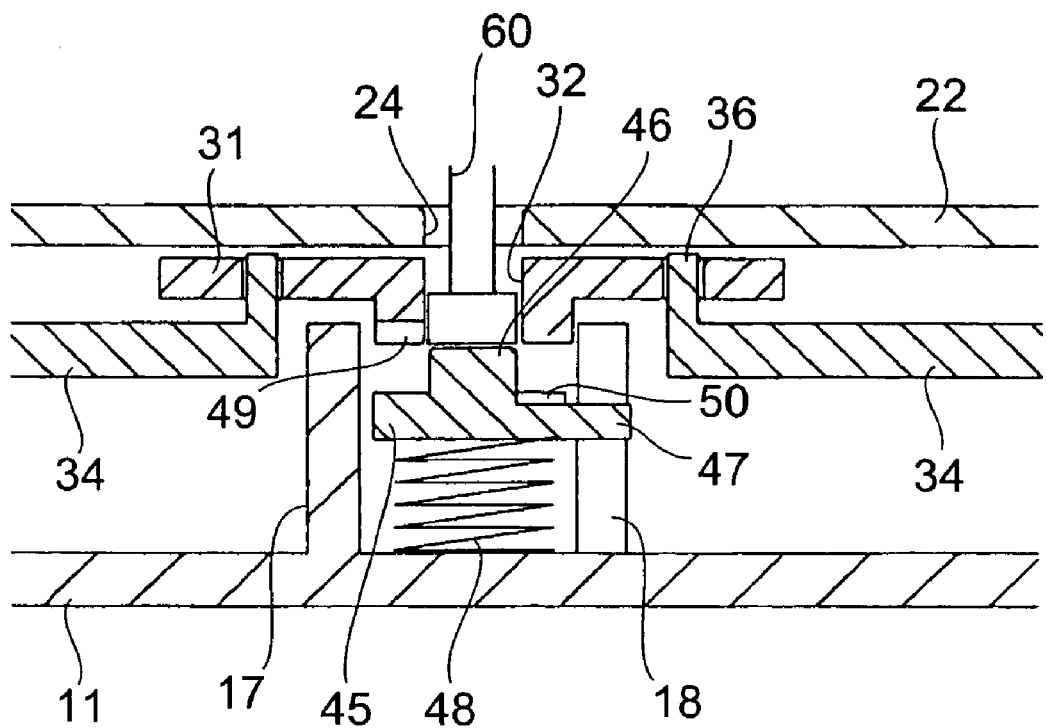
FIG. 15 is a cross sectional view showing the lock mechanism during an operation performed by means of the operation key.

As shown in FIG. 11 and FIG. 12, the rotating reel 31 is provided in the form of a circular disk, where the cylinder portion 31a is formed in a bottom face thereof. The approximately rectangular operation hole 32, when viewed from the front, to which the external operation key 60 is fitted is formed in a penetrating manner in a direction of a rotation axis in the central portion of the rotating reel 31. As shown in FIG. 13 to FIG. 15, the pressuring body 45 is provide in the form of approximately circular disk, and is slidably intruded in the cylindrical rib 17.

A central portion of the surface of the pressuring body 45 is provided with a cylindrical intruded portion 46. As shown in FIG. 14 and FIG. 15, the intruded portion 46 is inserted in the operation hole 32 of the rotating reel 31. Therefore, the pressuring body 45 can be operated by means of the operation key 60 from outside through the operation hole 32. A peripheral face of the pressuring body 45 is provided with a rotation regulating bar 47 in a radial direction. The rotation regulating bar 47 is embedded in the slit 18 of the cylindrical rib 17, thereby preventing the pressuring body 45 from rotating.

As the elastic body 48, a metal spring composed of SUS or the like, for example, resin spring, various thermoplastic elastomers composed of polyolefin type thermoplastic elastomer or ester type thermoplastic elastomer having an elastic deformation force, expanded polyolefin resin, NBR, fluororubber, urethane rubber, or the like can be used. The elastic body 48 is intruded into the cylindrical rib 17 and provided between the fitting plate 11 and the back of the pressuring body 45.

The abovementioned first protrusion 49 is provided at a predetermined interval of the angles (for example, 180 degrees) on a bottom face of the cylinder portion 31a of the rotating reel 31. The abovementioned second protrusion 50 is provided at a predetermined interval of angles (for example, 180 degrees) on the surface of the pressuring body 45. The first an second protrusions 49 and 50 are formed as protruding streaks extending in radial directions.

In the storage container of the above-described constitution, when the operation key 60 of the lid opening/closing device presses the intruded portion 46 of the pressuring body 45 via the operation hole 32 of the rotating reel 31 in order to bolt or unbolt the lid 10, the pressuring body 45 is separated from the rotating reel 31 while compressing the elastic body 48, as shown in FIG. 15, whereby the rotating reel 31 can be rotated.

When the operation key 60 of the lid opening/closing device is separated from the intruded portion 46 of the pressuring body 45 after the lid 10 is bolted or unbolted, the pressuring body 45 is brought into contact with the rotating reel 31 due to a guiding action of the cylindrical rib 17 and a biasing force of the elastic body 48, as shown in FIG. 14.

Figure 16:
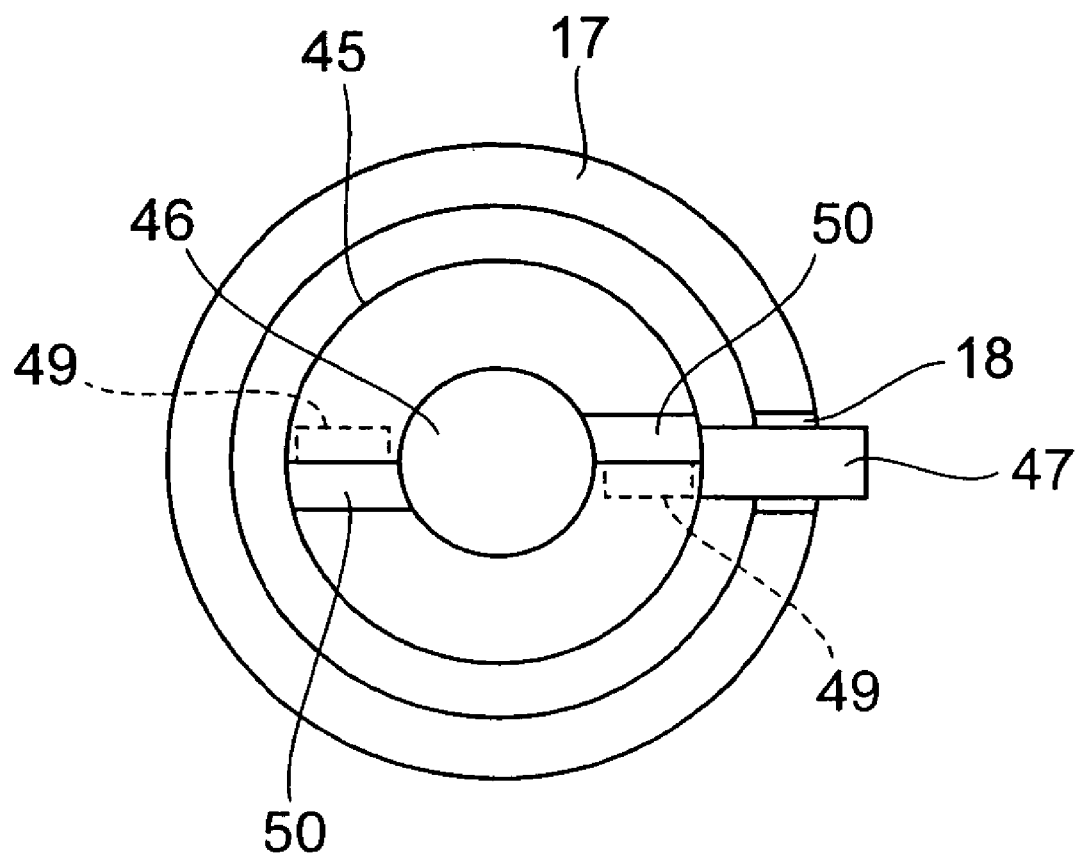
FIG. 16 and FIG. 17 are figures for explaining an engagement relationship between a first protrusion of the rotating reel and a second protrusion of the pressuring body.
Figure 17:
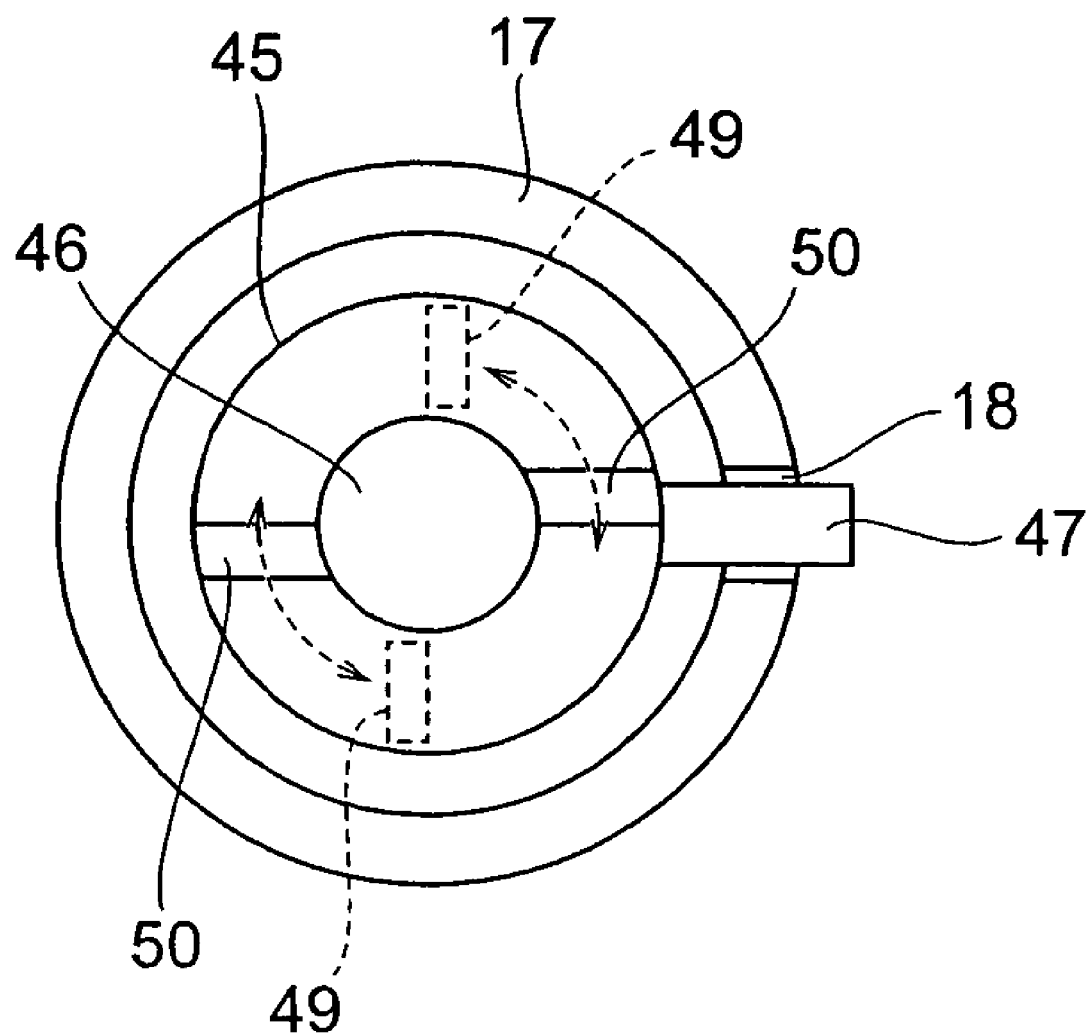
Figure 18:
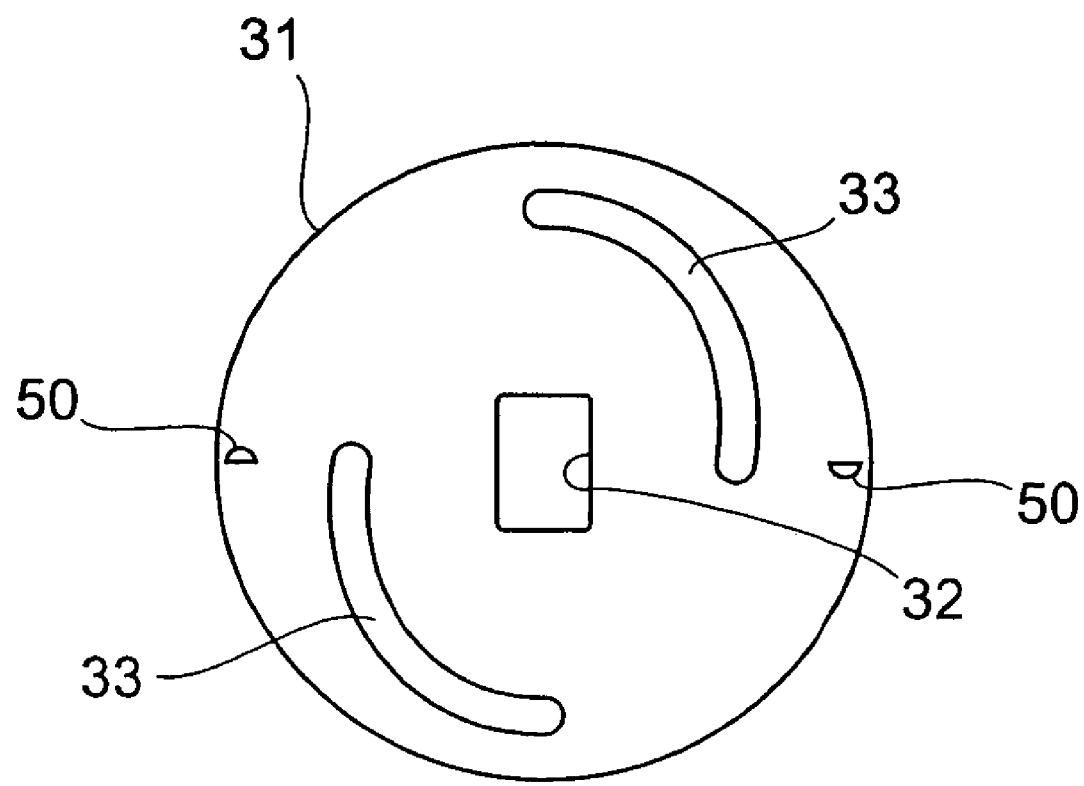
FIG. 18 is a figure showing the surface of a rotating reel of a storage container of a third embodiment.
Figure 19:
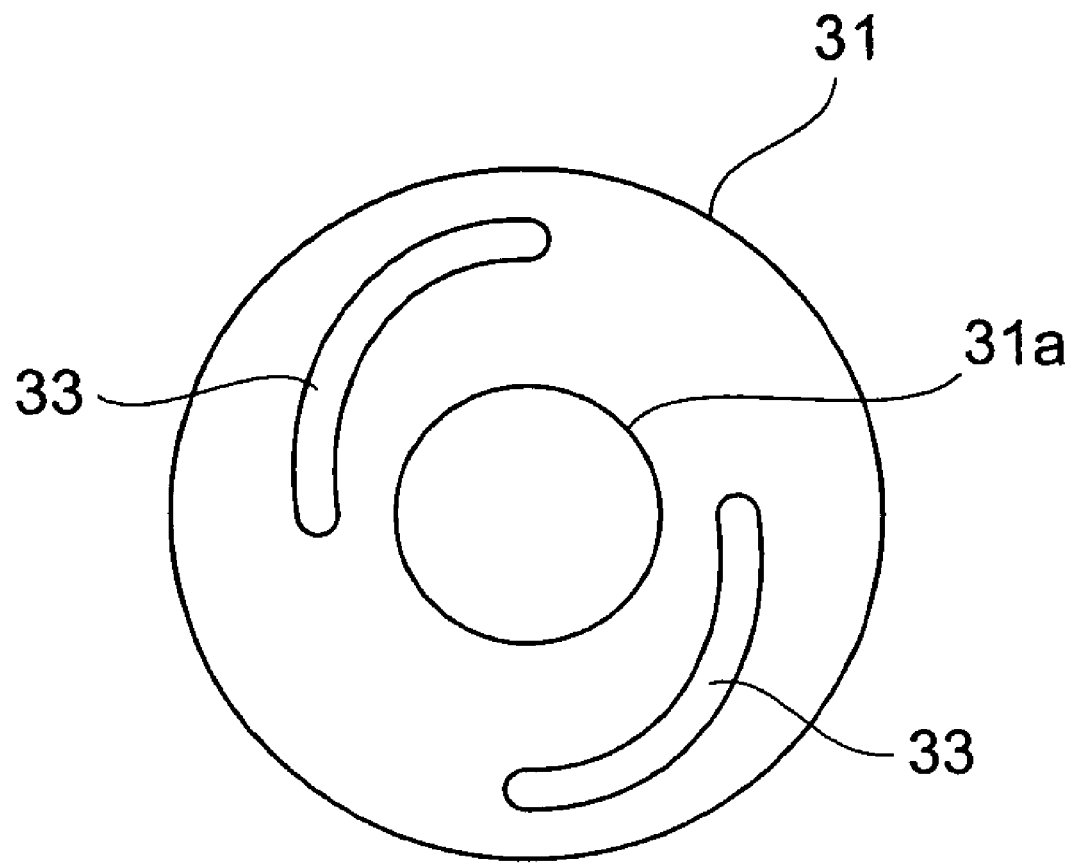
FIG. 19 is a figure showing the back of the rotating reel shown in FIG. 18.

In this manner, by rotating the rotating reel 31 by 90 degrees in a state where the pressuring body 45 is pressed by means of the operation key 60 and separated from the rotating reel 31, the first protrusion 49 of the rotating reel 31 which was in an unbolting position as shown in FIG. 17 is positioned in a bolting position as shown in FIG. 16. Then, by separating the operation key 60 from the pressuring body 45, the pressuring body 45 is brought into contact with the rotating reel 31 by being biased by the elastic boy 48, and the first protrusion 49 of the rotating reel 31 and the second protrusion 50 of the pressuring body 45 are engaged with each other. Accordingly, the rotating reel 31 is locked.

In the second embodiment as well, since the engagement between the first protrusion 49 and the second protrusion 50 causes locking of the rotating reel 31 when the lid 10 is bolted by the latch mechanism 30, there is no possibility that the rotating reel 31 is rotated by accident by a shaking or a shock at the time of shipping. Therefore, it is possible to extremely effectively prevent the sealability between the container main body 1 and the lid 10 from being impaired, the lid 10 from being removed from the container main body 1, and the precision substrate W from being contaminated.

Furthermore, the first protrusion 49 of the rotating reel 31 and the second protrusion 50 of the pressuring body 45 are strongly meshed with each other by the biasing force of the elastic body 48, thus there is less possibility that they are removed due to a shaking or a shock, and the rotating reel 31 can be prevented from being rotated easily.

Next, a storage container according to a third embodiment is now described with reference to FIG. 18 to FIG. 23. The storage container of the third embodiment is different from the storage container of the first embodiment, mainly in terms of the constitution of the lock mechanism 40.

The lock mechanism 40 comprises a first protrusion 50 provided in the rotating reel 31, a second protrusion 49 provided on the back of the cover plate 22 and engaged with the first protrusion 50, and the elastic body 48 biasing the rotating reel 31.

As shown in FIG. 18 to FIG. 21, the rotating reel 31 is provided in the form of a circular disk, where the cylinder portion 31a is formed in a bottom face thereof. The approximately rectangular operation hole 32, when viewed from the front, to which the external operation key 60 is fitted is formed in the surface central portion of the rotating reel 31.

The abovementioned first protrusion 50 is provided at a predetermined interval of the angles (for example, 180 degrees) on the surface of the rotating reel 31. The abovementioned second protrusion 49 is provided at a predetermined interval of angles (for example, 180 degrees) on the bottom face of the cover plate 22. The first and second protrusions 50 and 49 are respectively provided in approximately semi-circles in a plane.

Figure 21:
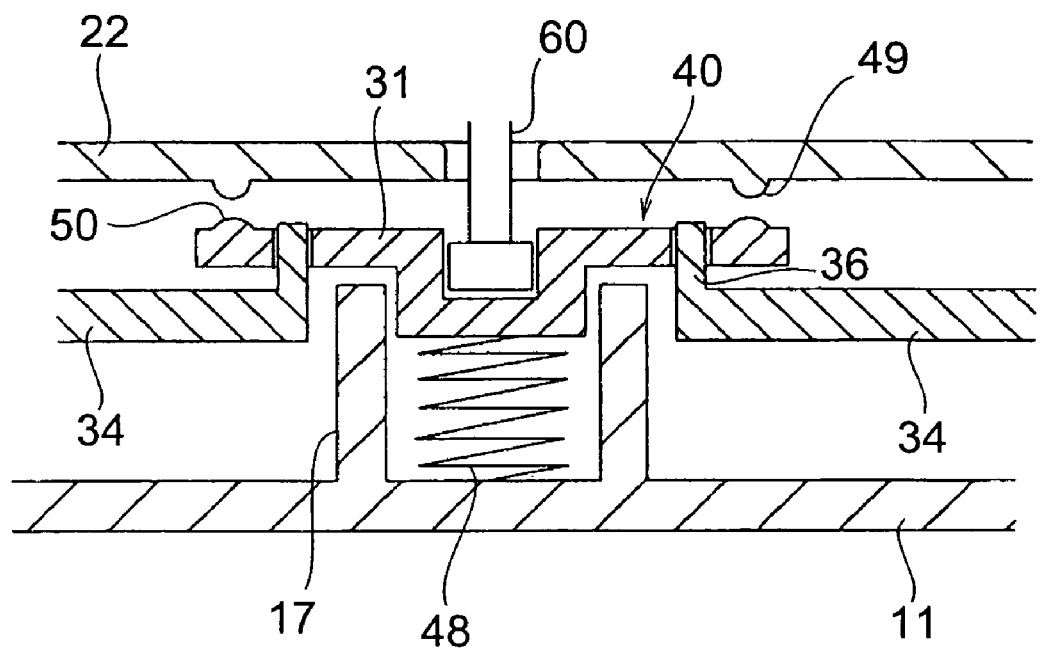
FIG. 21 is a cross sectional view showing the lock mechanism during an operation performed by means of the operation key.

In the storage container of the above-described constitution, when the operation key 60 of the lid opening/closing device is embedded in the operation hole 32 of the rotating reel 31 to press the rotating reel 31 in order to bolt or unbolt the lid 10, the rotating reel 31 is separated from the cover plate 22 while compressing the elastic body 48, as shown in FIG. 21, whereby the rotating reel 31 can be rotated.

Figure 20:
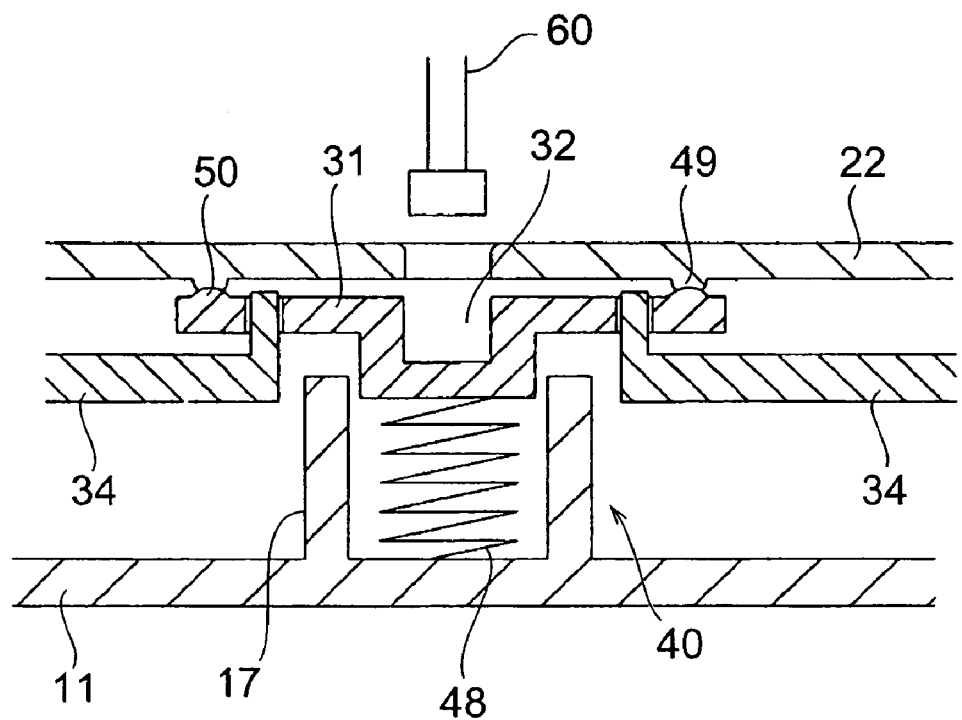
FIG. 20 is a cross sectional view showing the lock mechanism before an operation performed by means of the operation key.

When the operation key 60 of the lid opening/closing device is separated from the rotating reel 31 after the lid 10 is bolted or unbolted, the rotating reel 31 is brought into contact with the cover plate 22 due to a biasing force of the elastic body 48, as shown in FIG. 20.

Figure 22:
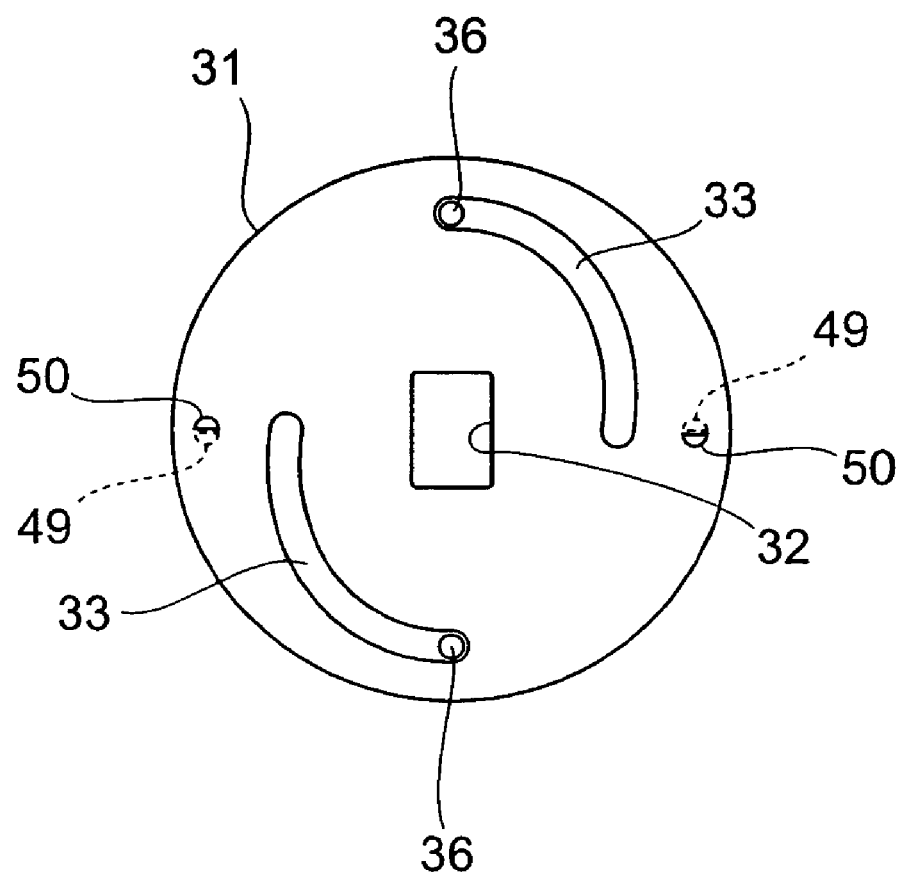
FIG. 22 and FIG. 23 are figures for explaining an engagement relationship between the first protrusion of the rotating reel and a second protrusion of the cover plate.
Figure 23:
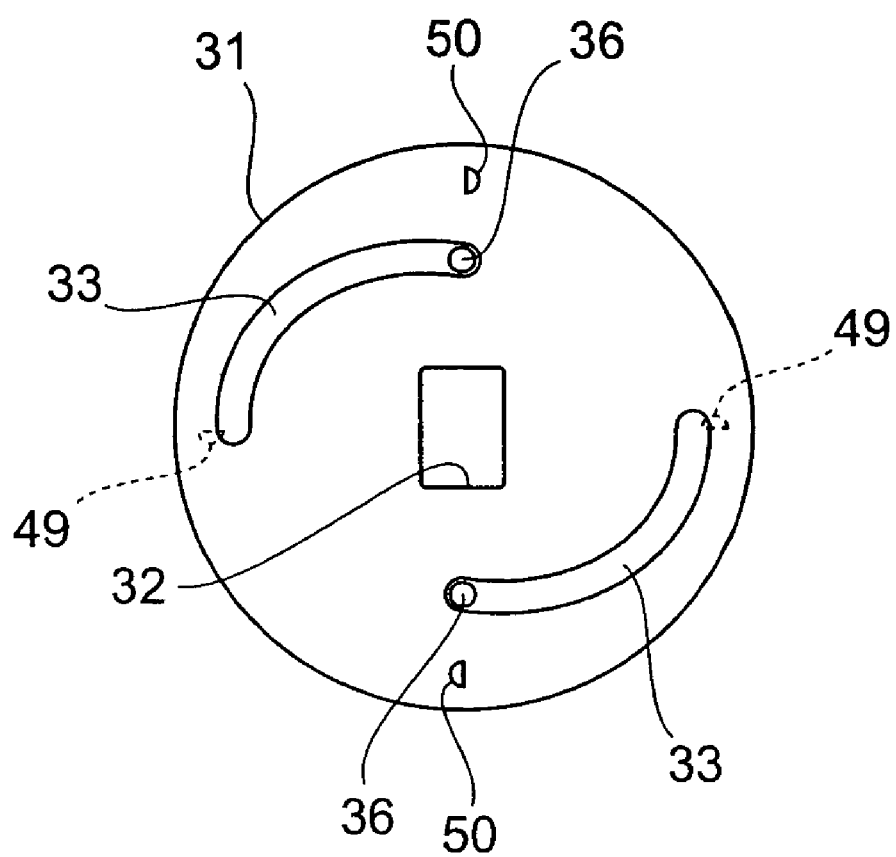

In this manner, by rotating the rotating reel 31 by 90 degrees in a state where the rotating reel 31 is pressed by means of the operation key 60 and separated from the cover plate 22, the first protrusion 50 of the rotating reel 31 which was in an unbolting position as shown in FIG. 23 is positioned in a bolting position as shown in FIG. 22. Then, by separating the operation key 60 from the rotating reel 31, the rotating reel 31 is brought into contact with the cover plate 22, and the first protrusion 50 of the rotating reel 31 an the second protrusion 49 of the cover plate 22 are engaged with each other. Accordingly, the rotating reel 31 is locked.

In the third embodiment as well, since the engagement between the first protrusion 50 and the second protrusion 49 causes locking of the rotating reel 31 when the lid 10 is bolted by the latch mechanism 30, there is no possibility that the rotating reel 31 is rotated by accident by a shaking or a shock at the time of shipping. Therefore, it is possible to extremely effectively prevent the sealability between the container main body 1 and the lid 10 from being impaired, the lid 10 from being removed from the container main body 1, and the precision substrate W from being contaminated.

Furthermore, in comparison with the storage container of the second embodiment, the slit 18 of the cylindrical rib 17 and the pressuring body 45 can be omitted, thus reduction of the number of components can be achieved.

Figure 24:
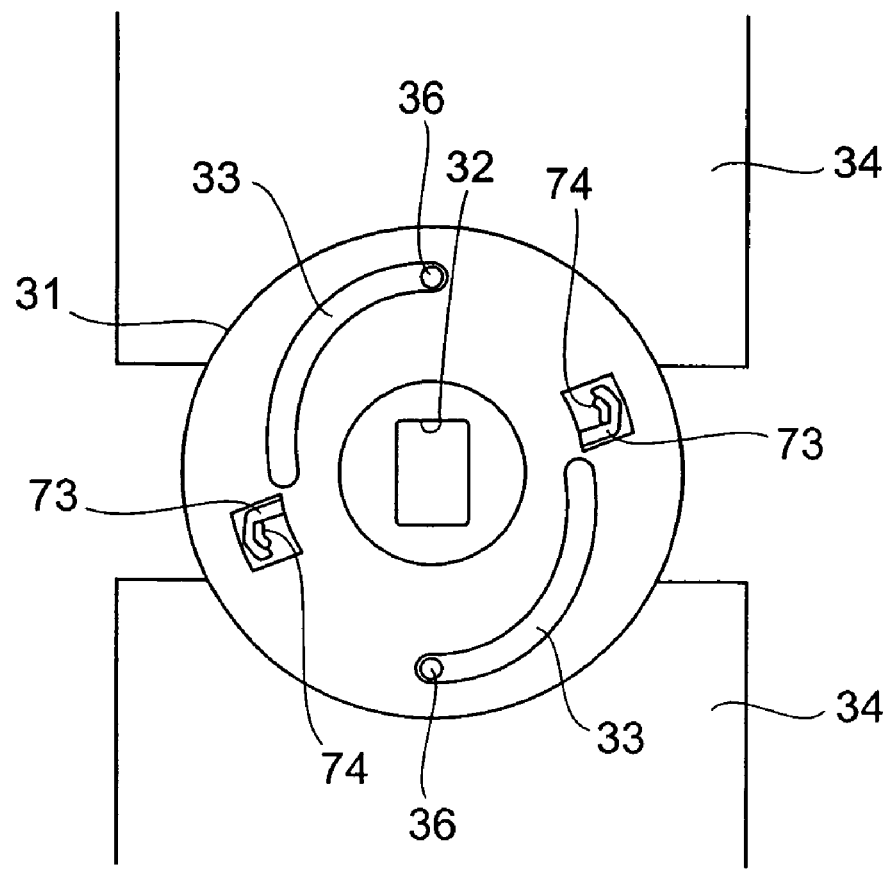
FIG. 24 is a figure for explaining the lock mechanism of a storage container of a fourth embodiment.

Next, a storage container according to a fourth embodiment is now described with reference to FIG. 24. The storage container of the fourth embodiment is different from the storage container of the first embodiment, mainly in terms of the constitution of the lock mechanism 40.

In the present embodiment, a pair of hooks 73 are directly fixed to the rotating reel 31 without providing the lock arm 41 as in the first embodiment. The hooks 73 are in the shape of approximately J, and a pair of protrusions 74 engaged with the hooks 73 are provided in the fitting plate 11. It should be noted that similar shapes such as a shape of V can be appropriately used. The hooks 73 have elasticity, and are snap-fitted to the protrusions 74 by being elastically deformed.

According to the above constitution, since the engagement between the hook 73 and the protrusion 74 causes locking of the rotating reel 31 when the lid 10 is bolted by the latch mechanism 30, there is no possibility that the rotating reel 31 is rotated by accident by a shaking or a shock at the time of shipping. Therefore, it is possible to extremely effectively prevent the sealability between the container main body 1 and the lid 10 from being impaired, the lid 10 from being removed from the container main body 1, and the precision substrate W from being contaminated.

The present invention is not limited to the above-described embodiments and can be deformed variously.

For example, the above-described embodiment has described the container main body 1 of front open box type where the lid 10 is opened only in a horizontal direction, but the front opening can be directed upward when removing the lid 10 or when taking the precision substrate W in and out.

The container main body 1 in which the bottom portion thereof is opened, the lid 10 for closing the rear opening of the container main body 1, and a cassette stored in the storage container 1 may be equipped, and the latch mechanism 30 and the lock mechanism 40 may be provided in a storage container of bottom open box type, which is called "SIMF pod".

The storage container can be a bottom open box type container (so-called "SIMF pod") that comprises a container main body 1 in which the bottom portion thereof is opened, the lid 10 for closing the rear opening of the container main body 1, and a cassette stored in the storage container. The latch mechanism 30 and the lock mechanism 40 may be provided in the container.

Further, it is preferred that the cams 19 and the cylindrical protrusions 37 of the latch arms 34 be provided in a position which is level with the fixing holes 13 provided in the peripheral wall of the fitting plate 11. In this manner, the cover late 22 can be prevented from being deflected when the lid 10 is fitted to the container main body 1, and locking of the locking nail 35 can be stably maintained.

Further, in the first embodiment, the lock arm 41 and the first and second hooks 70 and 71 may be provided on the front side of the rotating reel 31, and the first and second pins 44 and 44A may be provided on the bottom face of the cover plate 22. Similarly, in the fourth embodiment, the hook 73 may be provided on the front side of the rotating reel 31, and the protrusions 74 may be provided on the bottom face of the cover plate 22.

Furthermore, in the second embodiment, a protrusion may be provided on one of the rotating reel 31 and pressuring body 45, and a depressed portion engaged with the protrusion may be provided in the other one of them. Similarly, in the third embodiment, a protrusion may be provided on one of the rotating reel 31 and covering plate 22, and a depressed portion engaged with the protrusion may be provided in the other one of them.

In the second embodiment, only an upper end of the cylindrical rib 17 may be taken as a cylinder for supporting the rotating reel 31, the rest of the part may be taken as an angled cylinder, the angled pressuring body 45 may be intruded slidably in the angled cylinder part, and the rotation regulating bar 47 may be omitted.

Further, in the first embodiment, the first and second hooks 70 and 71 may be formed into the shape of J, L, Z or the like in a plane, and the first and second pins 44 and 44A may be constituted to the shapes corresponding to the above shapes of the first and second hooks 70 an 71.

In the third embodiment, the first and second protrusions 50 and 49 may be formed in to a circle, an elliptical shape, a polygonal shape, or the like in a plane.

Further, the container main body 1 may be of front open box type for storing, shipping, conveying, carrying and housing a stored object composed of various precision substrates (a 8 inch or 12 inch semiconductor wafer, a mask glass, a liquid crystal glass, a storage disk, etc) W, various works or the like. Also, the container main body 1 may be of top open box type which is used such that the top and bottom thereof are normally opened and that it is stored in an external box, and further which is used such that it is tilted when storing or taking various stored objects in and out. Further, the container main body 1 may be transparent, half transparent, or opaque, and provided with a see-through window on the backside wall, side wall, top wall or the like thereof. The lid 10 may be constituted to be transparent, half transparent, or opaque using one or plurality of plates.

Instead of the latching nail 35 for latching the lid 10, a latching roller, which appears from the opening 12 of the peripheral wall of the lid 10 as the latch arm 34 slides, may be provided in the tip end of the latch arm 34.

The latch arm 34 of the latch mechanism 30 may be formed into the form of a shaft, and the latching roller appearing from the opening 12 on the peripheral wall of the lid 10 may be fixed to a tip end of this shaft. When indirectly connecting the rotating reel 31 with the latch arm 34 in the form of a shaft, for example, the rotating reel 31 can be coupled to the latch arm 34 via a crank or the like.

Further, as a condition for preventing generation of dust, the latch mechanism 30 may comprise a gear which is supported by the lid 10 and rotated by an external operation, and the latch arm 34 which supported by the lid 10 slidably in a longitudinal direction and connected with the gear via other gear. At this moment, an end portion of the latch arm 34 may be rotatably supported in a position which is displaced from the central portion of the abovementioned other gear.

In the first and second embodiments, the number of hooks, pins, and protrusions can be increased or reduced accordingly from 1 to 4 or the like. Further, the engaging portion provided on the rotating reel 31 side can be formed as a bar, pin, or protrusion in the vicinity of the central portion, on the front side, back side, in the periphery portion or the like of the rotating reel. The engaging portion provided in the lid 10 can be formed as a bar, pin, or protrusion in accordance with the engaging portion provided on the rotating reel side. The engaging portion can be formed in an intervening portion lying between the lid 10 and the rotating reel 31.

The lock mechanism 40 may be constituted by a shutter which is embedded in the lid 10, exposes or covers the rotating reel 31, and can be opened/close, and a plug body made of elastomer or rubber, which can fit the rotating reel 31 exposed from the lid 10 from the outside of the lid 10. Moreover, one or plurality of spring members composed of various elastomers or rubbers having a spring function, a flat spring, coil spring or the like can be used as the elastic body 48.

It is clear from the above descriptions of the present invention that the present invention can be deformed variously. It cannot be admitted that such deformation departs from the idea and scope of the present invention, and an improvement which is obvious to all the skilled people is included in the following claims.

What is claimed is:

1. A storage container, comprising:
   a container main body having an opening through which a stored object is placed in or taken out;
   a lid comprising a fitting plate which fits the opening of the container main body;
   a cylindrical rib provided on the fitting plate;
   a latch mechanism provided on the lid, the latch mechanism having a rotating body rotatably supported by the lid and a pair of longitudinally slidable latch arms operably connected to the rotating body; and
   a lock mechanism having a first engaging portion provided on the rotating body, a pressuring body with a second engaging portion adapted to engage with the first engaging portion so as to lock the rotating body when the lid is bolted by the latch mechanism, and a biasing member which provides a biasing force against the pressuring body for enabling the pressuring body to contact with the rotating body,
   wherein the pressuring body is inserted in the cylindrical rib so as to slide along an axis of the cylindrical rib and the biasing member is provided between the pressuring body and the fitting plate in the cylindrical rib,
   wherein the rotating body is locked at a predetermined rotation angle position when the pressuring body contacts with the rotating body, and
   wherein the rotating body is rotatable when the pressuring body is separated from the rotating body against the biasing force of the biasing member.

2. The storage container according to claim 1, wherein the first engaging portion and the second engaging portion are protrusions which can be engaged with each other.

3. The storage container according to claim 1, wherein one of the first engaging portion and the second engaging portion is a protrusion, and the other is a depressed portion adapted to engage with the protrusion.

4. The storage container according to claim 1, wherein the rotating body is provided with a through-hole provided in a direction of a rotational axis, and the pressuring body is operable through the through-hole.

5. The storage container according to claim 1, wherein the biasing member comprises an elastic body.

* * * * *